(12) United States Patent
Yamazaki et al.

(10) Patent No.: US 9,601,178 B2
(45) Date of Patent: Mar. 21, 2017

(54) MEMORY DEVICE AND SEMICONDUCTOR DEVICE

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/350,086

(22) Filed: Jan. 13, 2012

(65) Prior Publication Data

US 2012/0188814 A1 Jul. 26, 2012

(30) Foreign Application Priority Data

Jan. 26, 2011 (JP) ................................. 2011-013908
May 14, 2011 (JP) ................................. 2011-108895

(51) Int. Cl.
*G11C 11/24* (2006.01)
*G11C 11/404* (2006.01)
(Continued)

(52) U.S. Cl.
CPC ........ *G11C 11/404* (2013.01); *G11C 11/4085* (2013.01); *H01L 21/84* (2013.01);
(Continued)

(58) Field of Classification Search
CPC ... G11C 11/404; G11C 11/4085; H01L 21/84; H01L 27/0688; H01L 27/1085;
(Continued)

(56) References Cited

U.S. PATENT DOCUMENTS 5,060,191 A 10/1991 Nagasaki et al.
5,731,856 A 3/1998 Kim et al.
(Continued)

FOREIGN PATENT DOCUMENTS

EP 1 737 044 A1 12/2006
EP 2 226 847 A2 9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — James G Norman
(74) *Attorney, Agent, or Firm* — Fish & Richardson P.C.

(57) ABSTRACT

To provide a memory device which operates at high speed or a memory device in which the frequency of refresh operations is reduced. In a cell array, a potential is supplied from a driver circuit to a wiring connected to a memory cell. The cell array is provided over the driver circuit. Each of memory cells included in the cell array includes a switching element, and a capacitor in which supply, holding, and discharge of electric charge are controlled by the switching element. Further, a channel formation region of the transistor used as the switching element includes a semiconductor whose band gap is wider than that of silicon and whose intrinsic carrier density is lower than that of silicon.

10 Claims, 23 Drawing Sheets

(51) Int. Cl.
- *G11C 11/408* (2006.01)
- *H01L 21/84* (2006.01)
- *H01L 27/06* (2006.01)
- *H01L 27/108* (2006.01)
- *H01L 27/12* (2006.01)
- *H01L 49/02* (2006.01)

(52) U.S. Cl.
CPC ...... *H01L 27/0688* (2013.01); *H01L 27/1085* (2013.01); *H01L 27/10873* (2013.01); *H01L 27/10891* (2013.01); *H01L 27/10897* (2013.01); *H01L 27/1207* (2013.01); *H01L 28/60* (2013.01)

(58) Field of Classification Search
CPC ......... H01L 27/10873; H01L 27/10891; H01L 27/10897; H01L 27/1207; H01L 28/60
See application file for complete search history.

(56) References Cited

U.S. PATENT DOCUMENTS

| | | | |
|---|---|---|---|
| 5,744,864 A | 4/1998 | Cillessen et al. | |
| 5,822,258 A * | 10/1998 | Casper | G11C 29/50 365/149 |
| 6,294,274 B1 | 9/2001 | Kawazoe et al. | |
| 6,504,742 B1 * | 1/2003 | Tran | G11O 5/02 257/E21.614 |
| 6,563,174 B2 | 5/2003 | Kawasaki et al. | |
| 6,577,531 B2 * | 6/2003 | Kato | 365/185.01 |
| 6,690,598 B2 | 2/2004 | Oguchi et al. | |
| 6,727,522 B1 | 4/2004 | Kawasaki et al. | |
| 6,765,844 B2 | 7/2004 | Fujisawa et al. | |
| 6,791,863 B2 | 9/2004 | Oguchi et al. | |
| 6,846,703 B2 | 1/2005 | Shimoda et al. | |
| 6,881,975 B2 | 4/2005 | Anzai et al. | |
| 6,972,985 B2 | 12/2005 | Rinerson et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,189,992 B2 | 3/2007 | Wager et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager et al. | |
| 7,385,224 B2 | 6/2008 | Ishii et al. | |
| 7,402,506 B2 | 7/2008 | Levy et al. | |
| 7,405,956 B2 | 7/2008 | Yang et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,554,169 B2 | 6/2009 | Anzai et al. | |
| 7,674,650 B2 | 3/2010 | Akimoto et al. | |
| 7,696,063 B2 | 4/2010 | Tsuchiya | |
| 7,732,819 B2 | 6/2010 | Akimoto et al. | |
| 7,888,207 B2 | 2/2011 | Wager et al. | |
| 7,889,538 B2 | 2/2011 | Toda | |
| 7,910,490 B2 | 3/2011 | Akimoto et al. | |
| 7,932,521 B2 | 4/2011 | Akimoto et al. | |
| 7,939,831 B2 | 5/2011 | Anzai et al. | |
| 8,008,137 B2 | 8/2011 | Wu et al. | |
| 8,036,010 B2 | 10/2011 | Maejima | |
| 8,044,448 B2 | 10/2011 | Kamigaichi et al. | |
| 8,068,358 B2 | 11/2011 | Maejima | |
| 8,202,365 B2 | 6/2012 | Umeda et al. | |
| 8,274,077 B2 | 9/2012 | Akimoto et al. | |
| 8,274,078 B2 | 9/2012 | Itagaki et al. | |
| 8,427,861 B2 | 4/2013 | Maejima | |
| 8,611,121 B2 | 12/2013 | Ahn et al. | |
| 8,625,332 B2 | 1/2014 | Maejima | |

| | | | |
|---|---|---|---|
| 2001/0001073 A1 * | 5/2001 | Yamazaki et al. | 438/166 |
| 2001/0015450 A1 * | 8/2001 | Sugibayashi | H01L 21/8221 365/51 |
| 2001/0046027 A1 | 11/2001 | Tai et al. | |
| 2002/0018357 A1 | 2/2002 | Oguchi et al. | |
| 2002/0056838 A1 | 5/2002 | Ogawa | |
| 2002/0132454 A1 | 9/2002 | Ohtsu et al. | |
| 2003/0057423 A1 | 3/2003 | Shimoda et al. | |
| 2003/0107926 A1 * | 6/2003 | Ohmura et al. | 365/200 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0251461 A1 | 12/2004 | Anzai et al. | |
| 2004/0257847 A1 * | 12/2004 | Matsui et al. | 365/63 |
| 2005/0017302 A1 | 1/2005 | Hoffman | |
| 2005/0128803 A1 * | 6/2005 | Luk | G11C 11/405 365/175 |
| 2005/0162933 A1 * | 7/2005 | Madurawe | H03K 19/17704 365/189.05 |
| 2005/0199959 A1 | 9/2005 | Chiang et al. | |
| 2005/0243595 A1 | 11/2005 | Rinerson et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0286737 A1 * | 12/2006 | Levy | B82Y 10/00 438/199 |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0023698 A1 * | 1/2008 | Li | H01L 29/7869 257/43 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1 * | 8/2008 | Hoffman et al. | 257/347 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |

(56) References Cited

U.S. PATENT DOCUMENTS

| | | |
|---|---|---|
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0045397 A1* | 2/2009 | Iwasaki ............ H01L 29/78693 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230435 A1 | 9/2009 | Maejima |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0187523 A1 | 7/2010 | Sakata et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0156027 A1 | 6/2011 | Yamazaki et al. |
| 2011/0163311 A1 | 7/2011 | Akimoto et al. |
| 2011/0207251 A1 | 8/2011 | Anzai et al. |
| 2011/0299318 A1 | 12/2011 | Kaneko et al. |
| 2012/0057396 A1 | 3/2012 | Yamazaki et al. |
| 2012/0063194 A1 | 3/2012 | Baek et al. |
| 2012/0063207 A1 | 3/2012 | Kato et al. |
| 2012/0063208 A1 | 3/2012 | Koyama et al. |
| 2012/0063209 A1 | 3/2012 | Koyama et al. |
| 2012/0120715 A1 | 5/2012 | Saito |
| 2012/0161127 A1 | 6/2012 | Kato et al. |
| 2012/0161132 A1 | 6/2012 | Yamazaki |
| 2012/0182790 A1 | 7/2012 | Yamazaki et al. |
| 2012/0256179 A1 | 10/2012 | Yamazaki et al. |

FOREIGN PATENT DOCUMENTS

| | | |
|---|---|---|
| EP | 2249348 A | 11/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-148763 A | 6/1990 |
| JP | 05-251705 A | 9/1993 |
| JP | 05-266670 A | 10/1993 |
| JP | 06097366 A | 4/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-086523 A | 3/2006 |
| JP | 2007096055 A | 4/2007 |
| JP | 2009-135350 A | 6/2009 |
| JP | 2010-020863 A | 1/2010 |
| JP | 2010-033674 A | 2/2010 |
| JP | 2010-034109 A | 2/2010 |
| JP | 4415062 | 2/2010 |
| JP | 2010-177431 A | 8/2010 |
| JP | 4571221 | 10/2010 |
| JP | 2010-263211 A | 11/2010 |
| WO | 2004/114391 A1 | 12/2004 |
| WO | WO-2008/133345 | 11/2008 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B

(56) References Cited

OTHER PUBLICATIONS (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N. et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound With New Long-Period Structure," Nirim Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.
Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center w/English translation.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; ppl 926-931; vol. 41, No. 6.

Taiwanese Office Action (Application No. 101101421) Dated Apr. 20, 2016.

\* cited by examiner

● In
☾ Sn
◡ Zn
• O

FIG. 15A       FIG. 15B
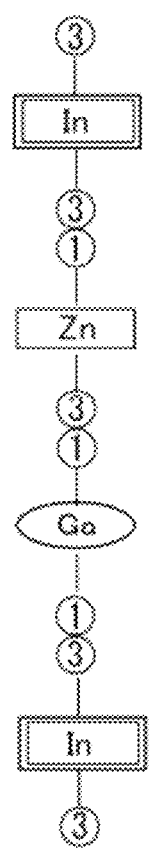
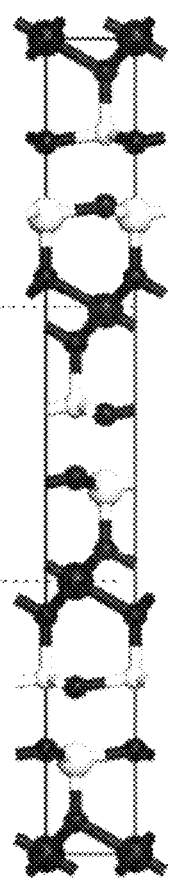
FIG. 15C
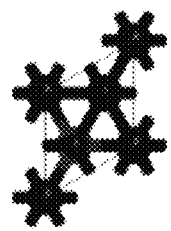
● In
○ Ga
○ Zn
● O

MEMORY DEVICE AND SEMICONDUCTOR DEVICE

BACKGROUND OF THE INVENTION

1. Field of the Invention

The present invention relates to a memory device and a semiconductor device including the memory device.

2. Description of the Related Art

In portable electronic devices such as a mobile phone, a smartphone, and an e-book reader, a semiconductor memory device (hereinafter, also simply referred to as a memory device) such as static random access memory (SRAM) or dynamic random access memory (DRAM), which writes and reads data at high speed, is used so as to store image data temporarily. In order to increase operation speed of the memory device, in the case of SRAM, it is effective to increase switching speed of transistors by miniaturization because data is stored with the use of flip-flops including a plurality of transistors. However, in the case of DRAM, data is stored by supply of electric charge to a capacitor; accordingly, an increase in switching speed of a transistor controlling supply of electric charge is not greatly effective to operation speed in writing and reading data.

Patent Document 1 discloses a semiconductor memory device in which two word lines are connected to each other at a word line parallel connecting point to reduce wiring resistance from that of a conventional circuit, so that delay in word lines is solved.

REFERENCE

[Patent Document 1] Japanese Patent Published Application No. H5-266670

SUMMARY OF THE INVENTION

As described in Patent Document 1, a decrease in resistance of wirings such as a word line allows an increase in writing and reading speed. However, in order to increase in writing and reading speed in the semiconductor memory device described in Patent Document 1, a ratio of the number of memory cells to the number of wirings such as bit lines and word lines needs to be increased. Accordingly, the yield is likely to be decreased because of defects such as a break and a short in a wiring due to dust or failure in etching. In addition, an increase in the number of wirings results in an increase in the area of the cell array.

DRAM is advantageous for large storage capacity as compared to other memory devices; however, memory capacity per unit area needs to be further increased as in other memory devices in order that an LSI having higher degree of integration is realized while an increase in a chip size is suppressed. However, when the area of a memory cell is reduced, the capacitance value is decreased due to a reduction in the area of a capacitor; therefore, difference of the amount of electric charge between the digital values becomes smaller and the frequency of refresh operations needs to be increased. Further, when the number of refresh operations is increased, power consumption of a memory device is increased and reliability is lowered because of deterioration of a transistor. In particular, when the transistor is miniaturized to reduce the area of the memory cell, the decrease in reliability is remarkable.

An object of the present invention is to provide a memory device which operates at high speed. An object of the present invention is to provide a memory device in which a frequency of refresh operations is reduced.

An object of the present invention is to provide a semiconductor device which operates at high speed. An object of the present invention is to provide a semiconductor device in which storage capacitance per unit area of a memory device is increased and a decrease in reliability is prevented.

In a memory device according to an embodiment of the present invention, any of memory cells among a plurality of memory cells in a cell array is connected to a wiring such as a word line or a data line. In an embodiment of the present invention, a potential generated at the driver circuit is supplied to the wiring such as a word line or a data line not from the outside of the cell array but from the inside of the cell array or between two memory cells among the plurality of memory cells connected to a wiring.

Therefore, in an embodiment of the present invention, focusing on a wiring, a distance between points (power feeding points) can be short. One of the points is a point in which a potential is supplied from the driver circuit to the wiring and the other of the points is a point in which a potential is supplied from the wiring to a memory cell provided in the edge portion of the cell array. Accordingly, even when the potential of the wiring drops because of the resistance of the wiring, the potential difference between the two points can be small.

Note that in the case where the wiring is a word line, the potential of a signal for selecting a memory cell is supplied from the driver circuit to the word line. In the case where the wiring is a data line, the potential of a signal including data is supplied from the driver circuit to the data line.

In an embodiment of the present invention, a cell array is provided over a driver circuit. A plurality of memory cells included in the cell array each include a switching element, and a capacitor in which supply, holding, and discharge of electric charge are controlled by the switching element. Further, a channel formation region of the transistor used as the switching element includes a semiconductor whose band gap is wider than that of silicon and whose intrinsic carrier density is lower than that of silicon.

As such a semiconductor, for example, an oxide semiconductor, silicon carbide, gallium nitride, or the like which has approximately twice or more as wide band gap as silicon can be given. A transistor including the semiconductor can have much lower off-state current than a transistor including a normal semiconductor material such as silicon or germanium. The transistor having the above structure is used as a switching element for holding charge flowing into a capacitor, whereby leakage of electric charge from the capacitor can be prevented.

A purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. Therefore, a transistor including the oxide semiconductor has a characteristic of extremely low off-state current. Specifically, the concentration of hydrogen in the highly-purified oxide semiconductor that is measured by secondary ion mass spectrometry (SIMS) is less than $5\times10^{18}/cm^3$ or lower, preferably less than or equal to $5\times10^{17}/cm^3$, more preferably less than or equal to $1\times10^{16}/cm^3$. In addition, the carrier density of the oxide semiconductor film that can be measured by Hall effect measurement is lower than $1\times10^{14}/cm^3$, preferably lower than $1\times10^{12}/cm^3$, more preferably lower than $1\times10^{11}/cm^3$. Furthermore, the band gap of the oxide semiconductor is 2 eV or more, preferably 2.5 eV or more, more preferably 3 eV or more. With the use of the oxide semiconductor film which is purified by sufficiently reducing the concentration of impurities such as moisture and hydrogen, off-state current of the transistor can be reduced.

The analysis of the concentration of hydrogen in the oxide semiconductor film is described here. The concentration of hydrogen in the semiconductor film is measured by SIMS. It is known that it is difficult to obtain accurate data in the proximity of a surface of a sample or in the proximity of an interface between stacked films formed using different materials by the SIMS in principle. Thus, in the case where the distribution of the hydrogen concentration of the film in a thickness direction is analyzed by SIMS, an average value in a region of the film, in which the value is not greatly changed and almost the same value can be obtained is employed as the hydrogen concentration. Further, in the case where the thickness of the film to be measured is small, a region where substantially the same value can be obtained cannot be found in some cases due to the influence of the hydrogen concentration of other films adjacent to the top and the bottom of the film. In that case, the maximum value or the minimum value of the hydrogen concentration in the region of the film is used as the hydrogen concentration of the film. Further, in the case where a mountain-shaped peak having the maximum value or a valley-shaped peak having the minimum value do not exist in the region of the film, the value at the inflection point is employed as the hydrogen concentration.

Various experiments can actually prove low off-state current of the transistor including the highly-purified oxide semiconductor film as an active layer. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at voltage (drain voltage) between the source electrode and the drain electrode of from 1 V to 10 V.

In this case, an off-state current density corresponding to a value obtained by dividing the off-state current by the channel width of the transistor is lower than or equal to 100 zA/μm. Further, an off-state current density was measured by use of a circuit in which a capacitor and the transistor are connected to each other and electric charge which is supplied to or discharged from the capacitor is controlled by the transistor. In the measurement, the highly-purified oxide semiconductor film was used as a channel formation region in the transistor, and change in the amount of electric charge of the capacitor per unit time is measured to obtain the off-state current density of the transistor. As a result, in the case where the voltage between the source electrode and the drain electrode of the transistor was 3 V, a lower off-state current density of several tens yoctoampere per micrometer (yA/μm) was able to be obtained. Accordingly, the transistor including the highly-purified oxide semiconductor film as an active layer has much lower off-state current than a transistor including silicon having crystallinity.

Unless otherwise specified, in the case of an n-channel transistor, an off-state current in this specification is current which flows between a source electrode and a drain electrode when the potential of the drain electrode is higher than that of the source electrode and that of a gate electrode while the potential of the gate electrode is less than or equal to zero when a reference potential is the potential of the source electrode. Further, in this specification, in the case of a p-channel transistor, an off-state current is current which flows between a source electrode and a drain electrode when the potential of the drain electrode is lower than that of the source electrode and that of a gate electrode while the potential of the gate electrode is greater than or equal to zero when a reference potential is the potential of the source electrode.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may include silicon.

In this specification, an In—Ga—Zn-based oxide means, for example, an oxide including In, Ga, and Zn, and there is no limitation on the ratio of In:Ga:Zn. Further, the In—Ga—Zn-based oxide may contain a metal element in addition to In, Ga, and Zn. Note that an In—Ga—Zn—O-based oxide has sufficiently high resistance when there is no electric field and thus off-state current can be sufficiently reduced. Moreover, also having high field-effect mobility, the In—Ga—Zn-based oxide is suitable for a semiconductor material used in a semiconductor device.

In an embodiment of the present invention, a difference between supplied potentials between a plurality of memory cells connected to one wiring can be small within a short time, whereby speed of operations such as writing or reading data can be increased.

In an embodiment of the present invention, a cell array is provided over a driver circuit, so that the size of a whole memory device including the driver circuit and the cell array can be small. Further, as described above, a transistor with extremely low off-state current is used as a switching element, whereby leakage of electric charge from a capacitor can be prevented and the frequency of refresh operations can be low. Therefore, power consumption of the memory device can be small and a reduction in reliability due to deterioration of transistor can be prevented. In addition, a reduction in frequency of refresh operations achieves high-speed operation of the memory device and the semiconductor device.

BRIEF DESCRIPTION OF THE DRAWINGS

FIGS. 15A to 15C are examples of an oxide semiconductor.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

The present invention includes in its category the following various kinds of semiconductor devices in which a memory device can be used: integrated circuits such as microprocessors, image processing circuits, digital signal processors (DSPs), and microcontrollers, memory devices such as RF tags and memory cards, and semiconductor display devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a circuit element using a semiconductor film is included in a driver circuit.

(Embodiment 1)

Figure 1:
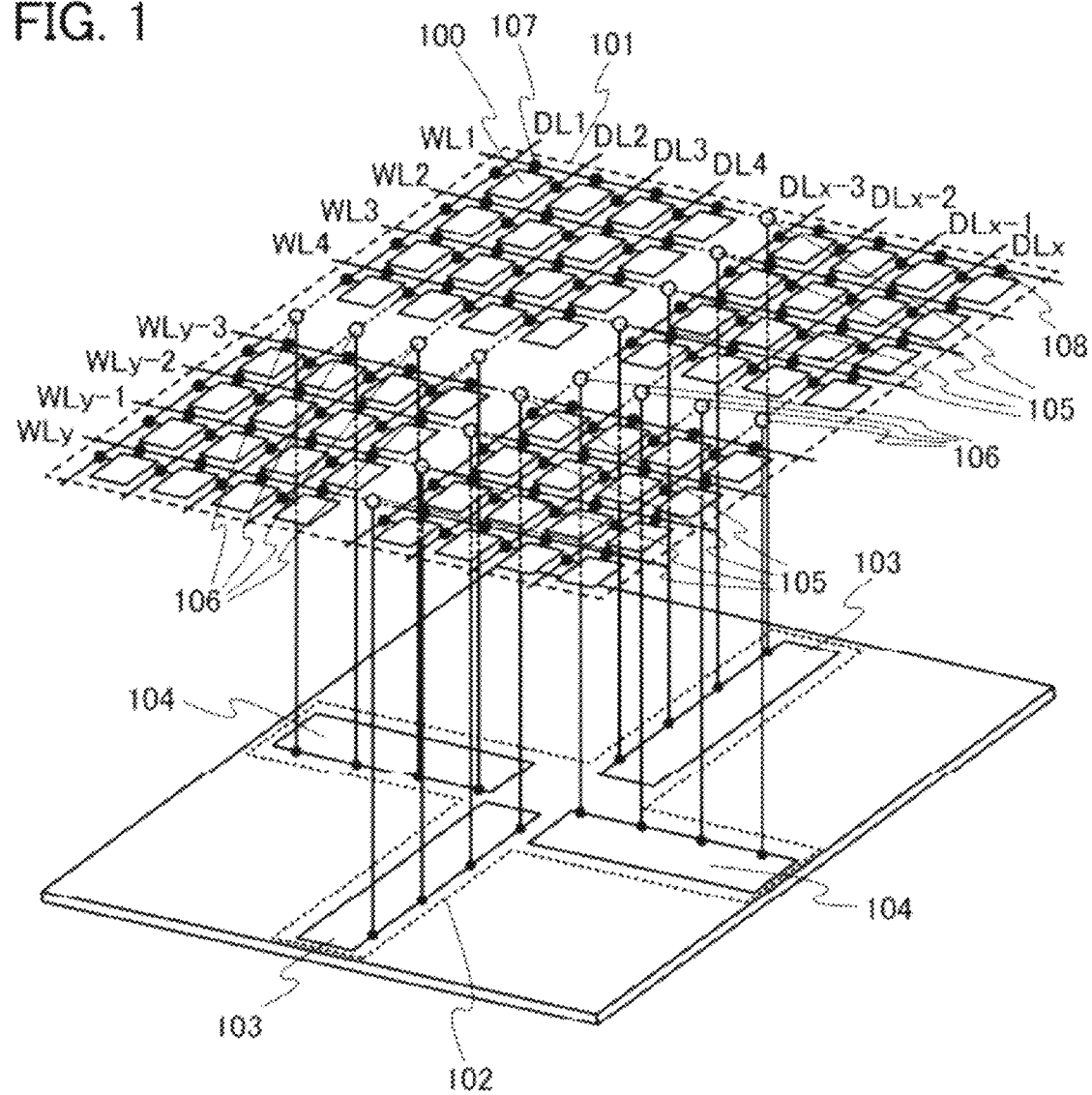
FIG. 1 illustrates a structure of a memory device.

FIG. 1 illustrates the structure of the memory device according to an embodiment of the present invention. The memory device illustrated in FIG. 1 includes a cell array 101 in which a plurality of memory cells 100 are arranged in matrix and a driver circuit 102 provided below the cell array 101.

Further, in the cell array 101, a plurality of wirings for supplying potentials to the memory cell 100 are provided. Specifically, a plurality of word lines WL and a plurality of data lines DL are provided for the cell array 101 illustrated in FIG. 1.

Note that the number of the wirings can be determined by the number of the memory cells 100 and arrangement of the memory cells 100 in the cell array 101. Specifically, FIG. 1 illustrates an example in the case where the memory cells 100 in x rows and y columns are connected in matrix and the word lines WL1 to WLy and the data lines DL1 to DLx are arranged in the cell array 101. Further, each of the memory cells 100 is connected to one of the plurality of data lines DL1 to DLx and one of the plurality of word lines WL1 to WLy.

The driver circuit 102 includes at least a word line driver circuit 103 which selects the word line WL by supply of a potential to the word line WL, and a data line driver circuit 104 which controls writing of data to the memory cell 100 connected to the selected word line WL. Further, the data line driver circuit 104 may include a reading circuit for reading data.

The word line driver circuit 103 and the data line driver circuit 104 can control operations such as writing of data to the cell array 101, reading of data from the cell array 101, holding of data in the cell array 101, or the like in accordance with a signal from the control circuit. Note that in FIG. 1, the control circuit which supplies a signal to the word line driver circuit 103 and the data line driver circuit 104 is not included in the driver circuit 102 and is assumed to be provided outside the memory device; however, the control circuit can be included as a component of the driver circuit 102.

The potential of a signal from the driver circuit 102 is supplied to each of the memory cells 100 through the plurality of word lines WL and the plurality of data lines DL. Specifically, the potential of a signal from the word line driver circuit 103 is supplied to the word lines WL. The potential supplied to one of the word lines WL is supplied to the plurality of memory cells 100 for one row connected to the one of the word lines WL. The potential of a signal from the data line driver circuit 104 is supplied to the data lines DL. The potential supplied to one of the data lines DL is supplied to the selected memory cell(s) 100 among the plurality of memory cells 100 for one column connected to the one of the data lines DL.

In an embodiment of the present invention, the potential generated at the driver circuit is supplied to wirings such as a word line WL, a data line DL, or the like, not from the outside of the cell array 101 but from the inside of the cell array 101 or between the memory cells 100. Specifically, FIG. 1 illustrates the case where the potential of a signal from the word line driver circuit 103 is supplied to the word lines WL1 to WLy between the memory cells 100 connected to the data line DL4 and the memory cells 100 connected to the data line DL(x−3). FIG. 1 illustrates the case where the potential of a signal from the data line driver circuit 104 is supplied to the data lines DL1 to DLx between the memory cells 100 connected to the word line WL4 and the memory cells 100 connected to the word line WL(y−3).

In FIG. 1, a power feeding point 105, in which a potential is supplied from the word line driver circuit 103 to the word lines WL1 to WLy, is denoted by a white circle. Further, a power feeding point 106, in which a potential is supplied from the data line driver circuit 104 to the data lines DL1 to DLx, is denoted by a white circle.

Note that FIG. 1 illustrates the case where the power feeding point 105 and the power feeding point 106 are provided between the memory cells 100; however, in an embodiment of the present invention, at least the power feeding point 105 or the power feeding point 106 may be provided in the cell array 101.

Further, FIG. 1 illustrates the case where the power feeding point 105 and the power feeding point 106 are provided inside the cell array 101; however, in an embodiment of the present invention, either the power feeding point 105 or the power feeding point 106 may be provided in the cell array 101.

Note that a plurality of conductive films which are in contact with one another can function as one wiring. Further, one conductive film can function as both a wiring and an electrode of a semiconductor element. Therefore, it is difficult to completely distinguish one wiring from the other components. In this specification, the position of a power feeding point in which a potential is supplied from the driver circuit to a wiring can be regarded as the position of a contact hole, in which the driver circuit and the wiring are connected and which is provided in an insulating film provided between a layer in which the driver circuit 102 is formed and a layer in which the cell array 101 is formed.

For example, points in which a potential is supplied from the word line WL1 to the memory cells 100 in the first column and the x-th column which are in the edge portions of the cell array 101, among the memory cells 100 connected to the word line WL1, are referred to as a power feeding point 107 and a power feeding point 108, respectively. In the case of a conventional structure in which a potential is supplied from the outside of the cell array 101 to the word line WL or the data line DL, a power feeding point X (not shown) for supplying a potential from the word line driver circuit 103 to the word line WL1 is placed at the edge portion of the cell array 101. Therefore, there is a great difference between a distance between the power feeding point X and the power feeding point 107 and a distance between the power feeding point X and the power feeding point 108. On the other hand, in the case of an embodiment of the present invention, a potential is supplied to the word lines WL or the data lines DL not from the outside of the cell array 101 but from the inside of the cell array 101 or between the memory cells 100. Therefore, focusing on the word line WL1, the power feeding point 105 in which a potential is supplied to the word line WL1 from the word line driver circuit 103 is in the cell array 101; thus, a difference between a distance between the power feeding point 105 and the power feeding point 107 and a distance between the power feeding point 105 and the power feeding point 108 is smaller than the case of the conventional structure. Therefore, even when the potential of the word line WL1 drops because of the resistance of the word line WL1, a potential difference between the power feeding point 107 and the power feeding point 108 can be small in comparison with the case of the conventional structure.

Similarly, in the case of the word lines WL other than the word line WL1 and the data lines DL, a potential difference between a power feeding point in which a potential is supplied to the wirings from the driver circuit 102 and a power feeding point in which a potential is supplied to the memory cell 100 placed in the edge portion of the cell array 101 from the wirings can be small. Accordingly, a potential difference between power feeding points of the memory cells 100 in the edge portion can be small.

Accordingly, a difference between supplied potentials between a plurality of memory cells 100 connected to one word line WL or data line DL can be small within a short time, whereby the speed of operations such as writing or reading data can be increased.

In an embodiment of the present invention, the cell array 101 is provided over the driver circuit 102, whereby the size of the whole memory device including the driver circuit 102 and the cell array 101 can be small.

Figure 2:
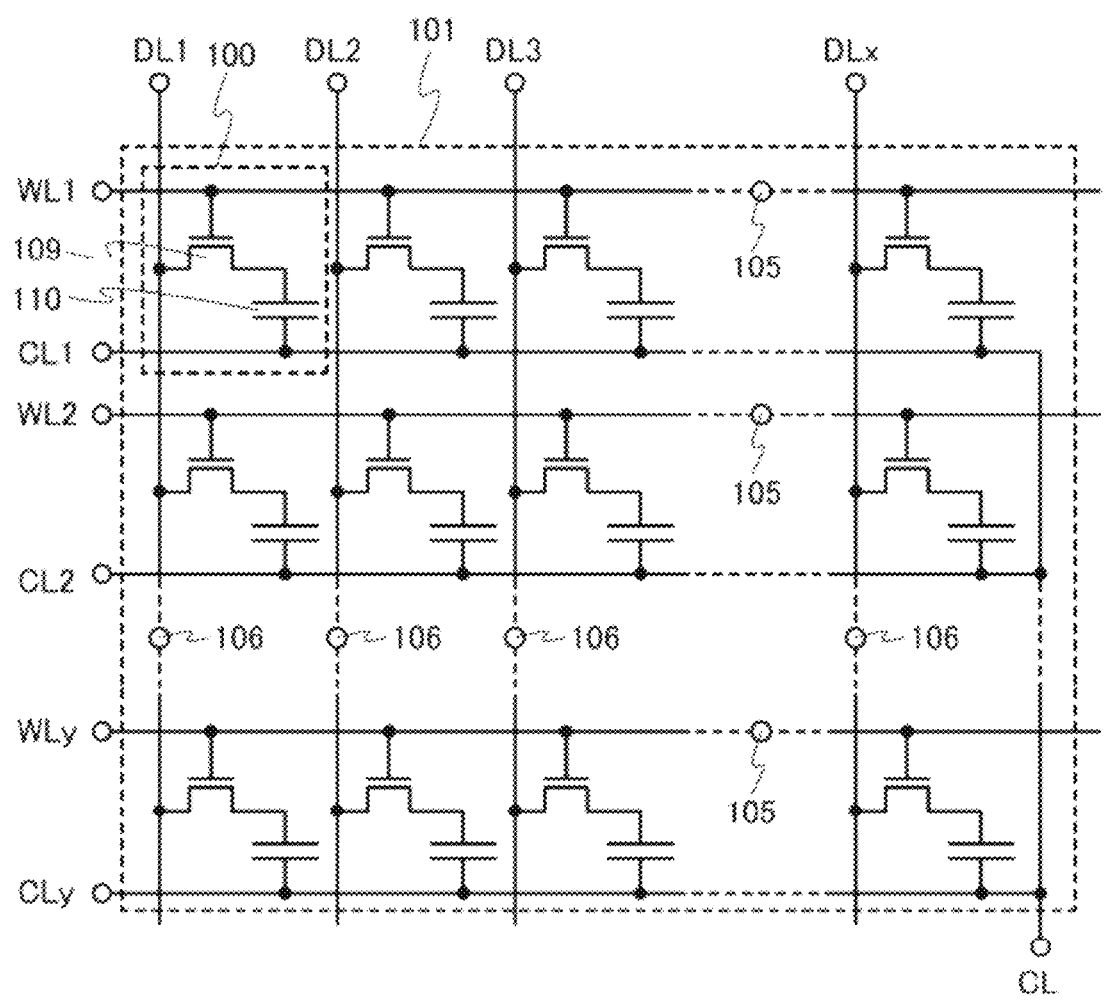
FIG. 2 is a circuit diagram of a cell array.

Next, FIG. 2 illustrates a specific example of a circuit diagram of the cell array 101 illustrated in FIG. 1. Wirings such as the plurality of word lines WL, the plurality of data lines DL, and a plurality of capacitor lines CL are provided in the cell array 101 illustrated in FIG. 2. The potential of a signal from the driver circuit or a power supply potential is supplied to each of the memory cells 100 through the above wirings.

Specifically, in FIG. 2, the power feeding point 105, in which a potential is supplied from the word line driver circuit to the word lines WL1 to WLy, is denoted by a white circle. Further, the power feeding point 106, in which a potential is supplied from the data line driver circuit to the data lines DL1 to DLx, is denoted by a white circle.

Each memory cell 100 includes a transistor 109 serving as a switching element and a capacitor 110. The memory cell 100 in FIG. 2 stores data by accumulating electric charge in the capacitor 110.

Note that the terms a "source terminal" and a "drain terminal" of a transistor interchange with each other depending on the polarity of the transistor or a difference between levels of potentials applied to the electrodes. In general, in an n-channel transistor, an electrode to which a lower potential is applied is called a source terminal, and an electrode to which a higher potential is applied is called a drain terminal. Further, in a p-channel transistor, an electrode to which a lower potential is applied is called a drain terminal, and an electrode to which a higher potential is applied is called a source terminal. Hereinafter, one of a source terminal and a drain terminal is referred to as a first terminal and the other is referred to as a second terminal, and a connection relationship of the transistor 109 and the capacitor 110 included in the memory cell 100 is described.

Specifically, a first terminal of the transistor 109 is connected to one of the data lines DL. A gate electrode of the transistor 109 is connected to one of the word lines WL. One of the pair of electrodes of the capacitor 110 that is not connected to the second terminal of the transistor 109 is connected to one of the capacitor lines CL.

Note that the memory cell 100 may further include another circuit element such as a transistor, a diode, a resistor, a capacitor, or an inductor when needed.

Note that the number of the wirings can be determined by the number of the memory cells 100 and arrangement of the memory cells 100. Specifically, the cell array 101 illustrated in FIG. 2 illustrates the case where the memory cells 100 in x columns and y rows are connected in matrix, and the word lines WL1 to WLy, the data lines DL1 to DLx, and the capacitor lines CL1 to CLy are arranged in the cell array 101.

Note that the "source terminal" of the transistor means a source region or a source electrode. Similarly, the "drain terminal" of the transistor means a drain region or a drain electrode.

In this specification, the "connection" means electrical connection and corresponds to the state in which current, voltage, or a potential can be supplied or transmitted. Accordingly, a connection state does not always mean a direct connection state but includes an indirect connection state through an element such as a wiring, a conductive film, a resistor, a diode, or a transistor so that current, voltage, or a potential can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Although FIG. 2 illustrates examples of the case where the transistor 109 has a single-gate structure, the transistor 109 may have a multi-gate structure in which a plurality of electrically connected gate electrodes are included so that a plurality of channel formation regions are included.

In an embodiment of the present invention, a channel formation region of the transistor 109 functioning as a switching element includes a semiconductor material whose band gap is wider than that of silicon and whose intrinsic carrier density is lower than that of silicon. With a channel formation region including a semiconductor material having the above characteristics, the transistor 109 whose off-state current is extremely low can be realized.

In the case where data is stored by control of the amount of electric charge as the memory cell 100 illustrated in FIG. 2, supply of electric charge to the memory cell 100, discharge of electric charge from the memory cell 100, and holding of electric charge in the memory cell 100 are controlled with the use of the transistor 109 functioning as a switching element. Thus, the length of a data holding time depends on the amount of leakage of electric charge accumulated in the memory cell 100, through the transistor 109. In an embodiment of the present invention, the off-state current of the transistor 109 can be extremely low as described above. Thus, the electric charge can be prevented from leaking, so that the data holding time can be made longer. Accordingly, the frequency of refresh operations can be low, so that power consumption of a memory device can be low and a decrease in reliability due to deterioration of transistor can be prevented; furthermore, a memory device and a semiconductor device can operate at high speed.

Note that as one example of a semiconductor whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be used. Compound semiconductors such as silicon carbide and gallium nitride are required to be single crystal, and it is difficult to meet the fabricating condition to obtain a single crystal material; for example, crystal growth at a temperature extremely higher than a process temperature of the oxide semiconductor is needed or epitaxial growth over a special substrate is needed. In addition, it is difficult to form such compound semiconductors over a silicon wafer or a glass substrate with low heat resistance, which can be obtained easily. On the contrary, the oxide semiconductor has the advantage that it can be formed by a sputtering method or a wet method (a printing method or the like) and has good mass productivity. Further, an oxide semiconductor can be formed at a room temperature, so that the oxide semiconductor can be formed over a glass substrate, or over an integrated circuit including a semiconductor element, and a larger substrate can be used. Accordingly, among the semiconductors with wide band gaps, the oxide semiconductor particularly has an advantage of high mass productivity. Further, in the case where a crystalline oxide semiconductor is used in order to improve the property of a transistor (e.g., mobility), the crystalline oxide semiconductor can be obtained by heat treatment at 200° C. to 800° C.

In the following description, an example in which an oxide semiconductor with the above advantages is used as a semiconductor film of the transistor 109 is given.

Note that although in FIG. 2, the memory cell 100 includes one transistor 109 functioning as a switching element, the present invention is not limited to this structure. In an embodiment of the present invention, it is acceptable as long as one transistor which functions as a switching element is provided in each memory cell, and the number of such transistors may be plural. In the case where the memory cell 100 includes a plurality of transistors serving as switching elements, the plurality of transistors may be connected to each other in parallel, in series, or in combination of parallel connection and series connection.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel means a state in which the first terminal of the first transistor is connected to the first terminal of the second transistor and the second terminal of the first transistor is connected to the second terminal of the second transistor.

Further, the transistor 109 includes at least a gate electrode on one side of an active layer, but may include a pair of gate electrodes with the active layer provided therebetween. In that case, one of the gate electrodes is supplied with a signal for controlling switching, and the other of the gate electrodes (a back gate electrode) may be in a floating state (i.e., electrically isolated) or may be supplied with a potential. In the latter case, potentials at the same level may be applied to the pair of electrodes, or a fixed potential such as a ground potential may be applied only to the back gate electrode. The level of the potential supplied to the back gate electrode is controlled, whereby the threshold voltage of the transistor 109 can be controlled.

Note that in an embodiment of the present invention, a wide-gap semiconductor material such as an oxide semiconductor may be included at least in an active layer of the transistor 109 which functions as a switching element. On the other hand, for an active layer of the transistor included in the driver circuit, an oxide semiconductor may be used or the following semiconductor other than the oxide semiconductor may be used: amorphous silicon, microcrystalline silicon, polycrystalline silicon, single crystal silicon, amorphous germanium, microcrystalline germanium, polycrystalline germanium, single crystal germanium, and the like. Note that when oxide semiconductor films are used for all of the transistors in the memory device, a manufacturing process can be simplified. Further, for example, the active layer of the transistor included in the driver circuit is formed using a semiconductor material such as polycrystalline silicon or single crystal silicon that has higher mobility than an oxide semiconductor, whereby the memory device can operate at high speed.

Figure 3:
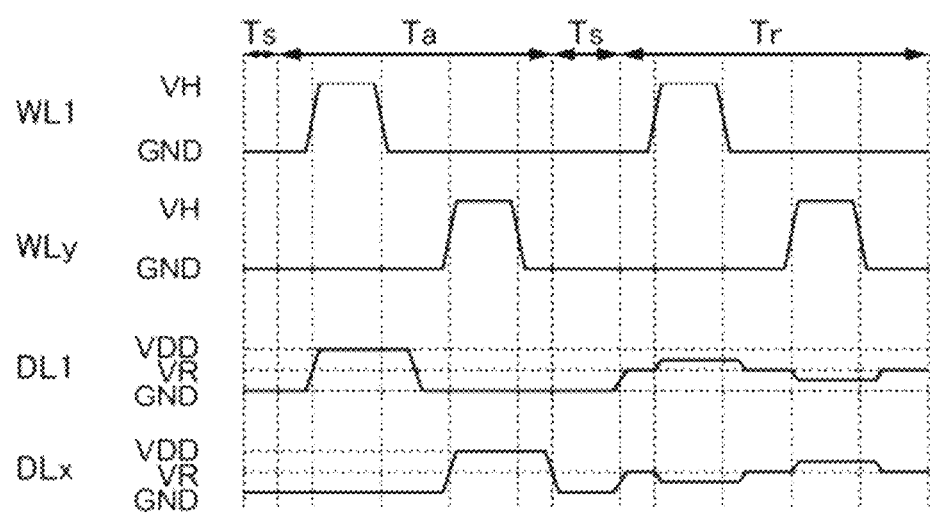
FIG. 3 is a timing diagram of operation of the cell array.

Next, the normal operation of the cell array 101 illustrated in FIG. 2 is described with reference to a timing diagram in FIG. 3. Note that FIG. 3 illustrates the case where data is written to, held in, and read from the memory cell 100 in the first column and the first row, the memory cell 100 in the x-th column and the first row, the memory cell 100 in the first column and the y-th row, and the memory cell 100 in the x-th column and the y-th row.

The operation of the cell array 101 in the writing period Ta is described. Data is written row by row. FIG. 3 illustrates the case where data is written to the memory cell 100 in the first column and the first row and the memory cell 100 in the x-th column and the first row, after that, data is written to the memory cell 100 in the first column and the y-th row and the memory cell 100 in the x-th column and the y-th row.

Note that in the writing period Ta, the ground potential is applied to all of the capacitor lines CL.

First, the word line WL1 connected to the memory cells 100 in the first row to which data is written is selected. Specifically, in FIG. 3, the high-level potential VH is applied to the word line WL1, and the ground potential GND is applied to the word lines WL, including the word line WLy, other than the word line WL1. Thus, only the transistors 109 whose gate electrodes are connected to the word line WL1 are selectively turned on.

In a period during which the word line WL1 is selected, potentials of signals including data are applied to the data lines DL1 and DLx. Needless to say, the levels of the potentials supplied to the data lines DL1 and DLx are varied depending on the content of the data. FIG. 3 illustrates the case where the high-level potential VDD is applied to the data line DL1 and the ground potential GND is applied to the data line DLx. The potentials applied to the data lines DL1 and DLx are applied to one electrode of the capacitor 110 via the transistors 109 that are on.

Note that the potential VH is equal to or higher than the potential VDD. Specifically, a potential difference between the potential VH and the potential VDD is equal to or higher than a threshold voltage of the transistor 109.

When one electrode of the capacitor 110 is a node FG, the potential of the node FG in the memory cell 100 in the first column and the first row becomes the potential VDD, and the potential of the node FG in the memory cell 100 in the x-th column and the first row becomes the ground potential GND in accordance with potentials applied to the data line DL1 and the data line DLx. The amount of electric charge supplied to the capacitor 110 is controlled in accordance with the potential of the node FG, whereby data is written to the memory cell 100 in the first column and the first row and the memory cell 100 in the x-th column and the first row.

Next, the ground potential GND is applied to the word line WL1. Thus, the transistors 109 whose gate electrodes are connected to the word line WL1 are turned off and the electric charge is held in the capacitors 110.

Note that in the case where an oxide semiconductor is used for the semiconductor film of the transistor 109, the transistor 109 has a feature that the off-state current is extremely low. Therefore, the electric charge held in the capacitors 110 is prevented from leaking, and thus, the data can be held for a long period of time as compared to the case where a semiconductor such as silicon is used for the transistor 109.

Next, a word line WLy which is connected to the memory cells 100 in the y-th row to which data is written is selected. Specifically, the high-level potential VH is applied to the word line WLy and the ground potential GND is applied to the word lines WL other than the word line WLy, including the word line WL1, in FIG. 3. Thus, only the transistors 109 whose gate electrodes are connected to the word line WLy are selectively turned on.

In a period during which the word line WLy is selected, potentials of signals including data are applied to the data lines DL1 and DLx. Needless to say, the levels of the potentials supplied to the data lines DL1 and DLx are varied depending on the content of the data. FIG. 3 illustrates the case where the ground potential GND is applied to the data line DL1 and the high-level potential VDD is applied to the data line DLx. The potential input to each of the data lines DL1 to DLx is applied, through each transistor 109 that is on, to one of electrodes of the capacitor 110. The potential of the node FG in the memory cell 100 in the first column and the y-th row becomes the ground potential GND, and the potential of the node FG in the memory cell 100 in the x-th column and the y-th row becomes the potential VDD in accordance with potentials applied to the data line DL1 and the data line DLx. The amount of electric charge supplied to the capacitor 110 is controlled in accordance with the potential of the node FG, whereby data is written to the memory cell 100 in the first column and the y-th row and the memory cell 100 in the x-th column and the y-th row.

Next, the ground potential GND is applied to the word line WLy. Thus, the transistors 109 whose gate electrodes are connected to the word line WLy is turned off and the electric charge is held in the capacitors 110.

In order to prevent writing of erroneous data to the memory cell 100, it is preferable to terminate a supply of a potential including data to the data line DL after each word line WL is selected.

Next, the operation of the cell array 101 in a data holding period Ts is described.

In the data holding period Ts, the ground potential is applied to all of the capacitor lines CL.

In the holding period Ts, a potential in which the transistor 109 is turned off, specifically, the ground potential GND is applied to all of the word lines WL. Accordingly, data is held while electric charge supplied to the capacitor 110 is held.

Then, the operation of the cell array 101 in a data reading period Tr is described.

In the data reading period Tr, the ground potential is applied to all of the capacitor lines CL.

In the reading period Tr, an intermediate-level potential VR is applied to the data line DL connected to the memory cells 100 from which data is read. Specifically, in FIG. 3, the intermediate-level potential VR is applied to the data line DL1 connected to the memory cells 100 in the first column and the data line DLx connected to the memory cells 100 in the x-th column. Note that the potential VR is equal to the potential VDD, or lower than the potential VDD and higher than the ground potential GND. After application of the potential VR, the data line DL1 and the data line DLx go to a floating-state.

Next, a word line WL1 which is connected to the memory cells 100 in the first row from which data is read is selected. Specifically, the high-level potential VH is applied to the word line WL1 and the ground potential GND is applied to the word lines other than the word line WL1, including the word line WLy, in FIG. 3. Thus, only the transistors 109 whose gate electrodes are connected to the word line WL1 are selectively turned on.

When the transistor 109 is turned on, electric charge held in the capacitor 110 is discharged to the data line DL which reads data or the electric charge is supplied from the data line DL which reads data to the capacitor 110. Operation to be performed is determined in accordance with the potential of the node FG in the holding period.

Specifically, according to the timing diagram shown in FIG. 3, the potential of the node FG in the memory cell 100 in the first column and the first row in the holding period before a reading period is the potential VDD. Thus, when the transistors 109 are turned on in the reading period, the electric charge is discharged from the capacitor 110 in the memory cell 100 in the first column and the first row into the data line DL1, so that the potential of the data line DL1 increases to be a potential VR+α. In the holding period before the reading period, the potential of the node FG in the memory cell 100 in the x-th column and the first row is the ground potential GND. Thus, when the transistors 109 are turned on in the reading period, the electric charge is supplied from the data line DLx into the capacitor 110 in the memory cell 100 in the x-th column and the first row, so that the potential of the data line DLx decreases to be a potential VR−β.

Therefore, the potential of the data line DL1 and the potential of the data line DLx depend on the amount of electric charge held in the capacitor 110 in the memory cell 100 in the first column and the first row and the capacitor 110 in the memory cell 100 in the x-th column and the first row, respectively. Then, by reading a difference in the amount of electric charge from the potential, data can be read from the memory cell 100 in the first column and the first row and the memory cell 100 in the x-th column and the first row.

After the data is read from the memory cell 100 in the first column and the first row and the memory cell 100 in the x-th column and the first row, the intermediate-level potential VR is applied again to the data line DL1 and the data line DLx so that the data line DL1 and the data line DLx are in the floating state.

Then, the word line WLy which is connected to the memory cells 100 in the first row from which data is read is selected. Specifically, the high-level potential VH is applied to the word line WLy and the ground potential GND is applied to the word lines other than the word line WLy, including the word line WL1, in FIG. 3. Thus, only the transistors 109 whose gate electrodes are connected to the word line WLy are selectively turned on.

When the transistor 109 is turned on, electric charge held in the capacitor 110 is discharged to the data line DL which reads data or the electric charge is supplied from the data line DL which reads data to the capacitor 110. Operation to be performed is determined in accordance with the potential of the node FG in the holding period.

Specifically, according to the timing diagram shown in FIG. 3, the potential of the node FG in the memory cell 100 in the first column and the y-th row in the holding period before a reading period is the ground potential GND. Thus, when the transistors 109 are turned on in the reading period, the electric charge is supplied from the data line DL1 into the capacitor 110 in the memory cell 100 in the first column and the y-th row, so that the potential of the data line DL1 decreases to be the potential VR−β. In the holding period before the reading period, the potential of the node FG in the memory cell 100 in the x-th column and the y-th row is the potential VDD. Thus, when the transistors 109 are turned on in the reading period, the electric charge is discharged from the capacitor 110 in the memory cell 100 in the x-th column and the y-th row into the data line DLx, so that the potential of the data line DLx increases to be the potential VR+α.

Therefore, the potential of the data line DL1 and the potential of the data line DLx depend on the amount of electric charge held in the capacitor 110 in the memory cell 100 in the first column and the y-th row and the capacitor 110 in the memory cell 100 in the x-th column and the y-th row, respectively. Then, by reading a difference in the amount of electric charge from the potential, data can be read from the memory cell 100 in the first column and the y-th row and the memory cell 100 in the x-th column and the y-th row.

A reading circuit included in the data line driver circuit is connected to an end of each data line DL, and a signal output from the reading circuit includes data which is actually read from the cell array 101.

(Embodiment 2)

An example of a specific structure of the driver circuit in the memory device will be described.

Figure 4:
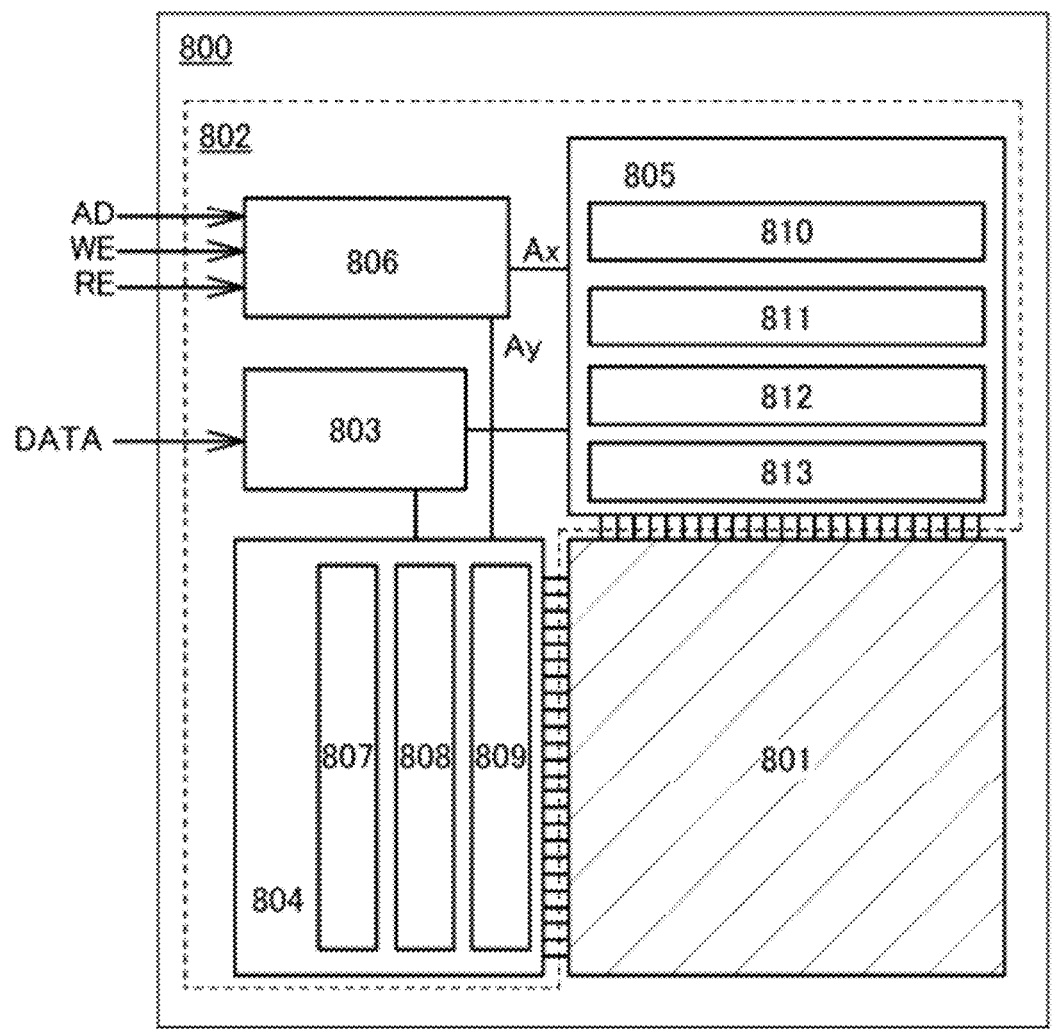
FIG. 4 is a block diagram illustrating a structure of a memory device.

FIG. 4 illustrates a block diagram of a specific structure of the memory device as an example. In the block diagram in FIG. 4, circuits in the memory device are classified in accordance with their functions and illustrated as separate blocks; however, it is difficult to classify actual circuits according to their functions completely and one circuit may have a plurality of functions.

A memory device 800 illustrated in FIG. 4 includes a cell array 801 and a driver circuit 802. The driver circuit 802 includes an input-output buffer 803; a word line driver circuit 804 configured to control the potential of a word line; a data line driver circuit 805 configured to control writing and reading of data to/from a memory cell; and a control circuit 806 configured to control operations of the input-output buffer 803, the word line driver circuit 804, and the data line driver circuit 805.

In the memory device 800 illustrated in FIG. 4, the word line driver circuit 804 includes a row decoder 807, a level shifter 808, and a buffer 809. The data line driver circuit 805 includes a column decoder 810, a level shifter 811, a selector 812, and a reading circuit 813.

Note that the cell array 801, the input-output buffer 803, the word line driver circuit 804, the data line driver circuit 805, and the control circuit 806 may be formed using one substrate; any one of them may be formed using a substrate different from a substrate for the others; or all of them may be formed using different substrates.

In the case where different substrates are used, electrical connection between the substrates can be ensured with the use of an FPC (flexible printed circuit) or the like. In that case, part of the driver circuit 802 may be connected to an FPC by a COF (chip on film) method. Further, electrical connection can be ensured by a COG (chip on glass) method.

When a signal AD including an address Ax and address Ay of the cell array 801 as data is input to the memory device 800, the control circuit 806 transmits the address Ax in a column direction and the address Ay in a row direction to the data line driver circuit 805 and the word line driver circuit 804, respectively. In addition, the control circuit 806 transmits a signal DATA including data input to the memory device 800 to the data line driver circuit 805 through the input-output buffer 803.

Operation of writing data and operation of reading data in the cell array 801 are selected in accordance with a signal RE (read enable), a signal WE (write enable), or the like supplied to the control circuit 806. Further, in the case where the plurality of cell arrays 801 are provided, a signal CE (chip enable) for selecting the cell array 801 may be input to the control circuit 806. In that case, operation selected in accordance with the signal RE or the signal WE is performed in the cell array 801 selected in accordance with the signal CE.

In the cell array 801, when the writing operation is selected in accordance with the signal WE, a signal for selecting a memory cell corresponding to the address Ay is generated in the row decoder 807 included in the word line driver circuit 804 in response to an instruction from the control circuit 806. The amplitude of the signal is adjusted by the level shifter 808, and then the processed signal is input to the cell array 801 through the buffer 809. In the data line driver circuit 805, a signal for selecting a memory cell corresponding to the address Ax among the memory cells selected in the column decoder 810 is generated in response to an instruction from the control circuit 806. The amplitude of the signal is adjusted by the level shifter 811, and then the processed signal is input to the selector 812. In the selector 812, the signal DATA is sampled in accordance with the input signal, and the sampled signal is input to a memory cell corresponding to the addresses Ax and Ay.

In the cell array 801, when the reading operation is selected in accordance with the signal RE, a signal for selecting a memory cell corresponding to the address Ay is generated in the row decoder 807 included in the word line driver circuit 804 in response to an instruction from the control circuit 806. The amplitude of the signal is adjusted by the level shifter 808, and then the processed signal is input to the cell array 801 through the buffer 809. In the reading circuit 813, a signal for selecting a memory cell corresponding to the address Ax among the memory cells selected in the row decoder 807 is generated in response to an instruction from the control circuit 806. Data stored in the memory cell corresponding to the addresses Ax and Ay is read, and a signal including the data is generated.

Note that the data line driver circuit 805 may include a page buffer which can temporarily store the signal DATA, a precharge circuit which supplies the potential VR in advance to a data line in reading of data, or the like.

This embodiment can be implemented by being combined as appropriate with any of the above embodiments.

(Embodiment 3)

Next, a specific structural example of the reading circuit will be described.

The levels of potentials read from the cell array are determined in accordance with data written to the memory cells. Accordingly, ideally, potentials having the same level should be read from the plurality of memory cells when data with the same digital value is stored in the plurality of memory cells. However, practically, there is a case where the characteristics of as capacitors and transistors which function as switching elements vary among the memory cells. In that case, the potentials actually read vary even when all of the data to be read have the same digital value, so that the levels of the potentials can be widely distributed. However, even when potentials read from the cell array vary slightly, a reading circuit can generate a signal including accurate data and having an amplitude and a waveform processed in accordance with a desired specification.

Figure 5:
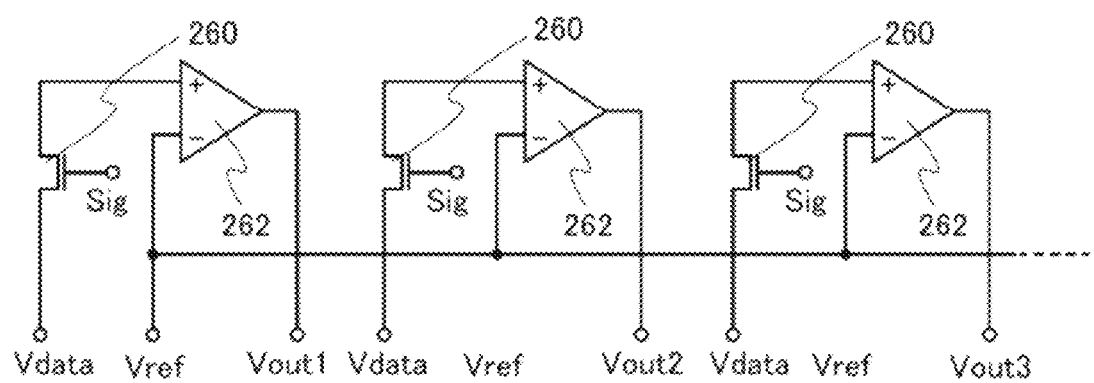
FIG. 5 illustrates a structure of a reading circuit.

FIG. 5 is a circuit diagram illustrating a structural example of the reading circuit. The reading circuit illustrated in FIG. 5 includes transistors 260 which function as switching elements for controlling the input of potentials Vdata read from a cell array by the reading circuit. The reading circuit illustrated in FIG. 5 further includes operational amplifiers 262.

The transistor 260 which functions as a switching element controls the supply of a potential Vdata to a non-inverting input terminal (+) of the operational amplifier 262 in accordance with a potential of a signal Sig applied to a gate electrode of the transistor 260. For example, when the transistor 260 is turned on, the potential Vdata is applied to the non-inverting input terminal (+) of the operational amplifier 262. In contrast, a reference potential Vref is supplied to inverting input terminals (−) of the operational amplifiers 262. The levels of potentials Vout of output terminals can be changed depending on the level of the potential applied to the non-inverting input terminals (+) with respect to the reference potential Vref. Thus, a signal which indirectly includes data can be obtained.

Note that even if data with the same value is stored in memory cells, fluctuation in levels of the read potential Vdata occurs due to variation in characteristics of the memory cells, so that the levels of potentials might be widely distributed. Thus, the level of the reference potential Vref is determined in consideration of fluctuation in the potential Vdata in order to read the value of data accurately.

Since FIG. 5 illustrates an example of a reading circuit at the time when a binary digital value is used, one operational amplifier used for reading data is used for one node to which the potential Vdata is applied. However, the number of operational amplifiers is not limited thereto. When n-valued data (n is a natural number of 2 or more) is used, the number of operational amplifiers used for one node to which the potential Vdata is applied is (n−1).

This embodiment can be implemented by being combined as appropriate with any of the above embodiments.

(Embodiment 4)

In this embodiment, a method for manufacturing a memory device will be described by giving an example in which an oxide semiconductor is used for an active layer of a transistor 109 in a memory cell 100 and silicon is used for an active layer of a transistor included in a driver circuit, illustrated in FIG. 2.

Besides silicon, a semiconductor material such as germanium, silicon germanium, or single crystal silicon carbide may be used for the transistor included in the driver circuit. For example, the transistor including silicon can be formed using a single crystal semiconductor substrate such as a silicon wafer, a silicon thin film which is formed by an SOI method, a silicon thin film which is formed by a vapor deposition method, or the like. Alternatively, in an embodiment of the present invention, all of the transistors included in the memory cells may include an oxide semiconductor.

Figure 6A:
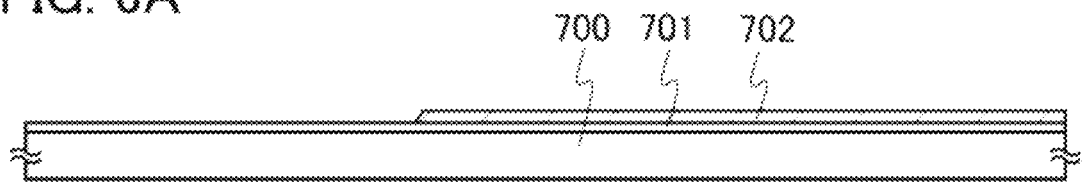
FIGS. 6A to 6D illustrate a method for manufacturing a memory device.

In this embodiment, first, as illustrated in FIG. 6A, an insulating film 701 and a single crystal semiconductor film 702 are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is greater than or equal to 730° C. is preferably used as the glass substrate.

In this embodiment, an example in which the semiconductor film 702 is formed using single crystal silicon is given as a method for forming the transistor included in the driver circuit. Note that a specific example of a method for forming the single crystal semiconductor film 702 is briefly described. First, an ion beam including ions which are accelerated by an electric field enters a bond substrate which is the single crystal semiconductor substrate and an embrittlement layer which is fragile because of local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm² to 500 N/cm², preferably 11 N/cm² to 20 N/cm² is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, whereby the microvoids that exist in the embrittlement layer are coupled, so that a volume of microvoids are increased. Accordingly, a single crystal semiconductor film which is part of the bond substrate is separated from the bond substrate along the embrittlement layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by a vapor deposition method may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, a crystallization method combined with a thermal crystallization method using an electrically heated oven, a lamp annealing crystallization method using infrared light, a crystallization method using a catalytic element, or a high-temperature annealing method at approximately 950° C., may be used.

Figure 6B:
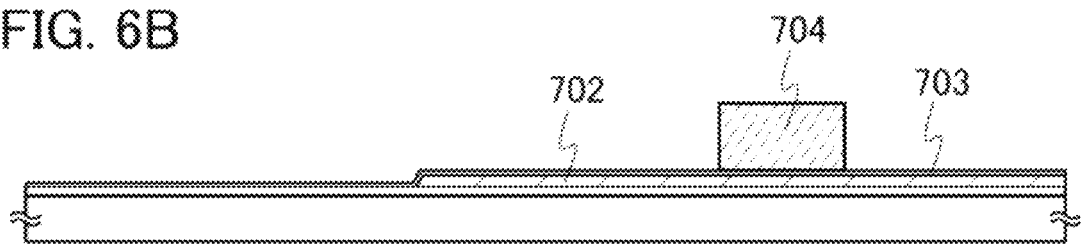

Next, as illustrated in FIG. 6B, a gate insulating film 703 is formed over the semiconductor film 702. Then, a gate electrode 704 is formed over the gate insulating film 703.

The gate insulating film 703 can be formed by oxidation or nitriding of a surface of the semiconductor film 702 by high-density plasma treatment, heat treatment, or the like. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, a surface of the semiconductor film 702 is oxidized or nitrided using nitrous oxide ($N_2O$) diluted with Ar by 1 times to 3 times (flow ratio) by application of a microwave (2.45 GHz) power of 3 kW to 5 kW at a pressure of 10 Pa to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by a vapor deposition method, thereby forming the gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Moreover, in the case where the semiconductor film has crystallinity, the surface of the semiconductor film is oxidized with solid-phase reaction by the high-density plasma treatment to suppress fast oxidation only in a crystal grain boundary; therefore, the gate insulating film with uniformity and low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers using a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by a plasma CVD method, a sputtering method, or the like.

Note that, in this specification, an oxynitride refers to a material containing a larger amount of oxygen than that of nitrogen, and a nitride oxide refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxynitride with a thickness of about 20 nm formed by a plasma CVD method is used as the gate insulating film 703.

A conductive film is formed so as to cover the gate insulating film 703 and then is processed (patterned) into a predetermined shape, so that the gate electrode 704 can be formed. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the above-described metal as a main component or a compound containing the above-described metal may be used. Alternatively, the conductive film may be formed using a semiconductor such as polycrystalline silicon doped with an impurity element such as phosphorus which imparts conductivity to the semiconductor film.

Note that the gate electrode 704 may be formed using a single-layer conductive film or a stacked-layer conductive film of a plurality of films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, a heat treatment aimed at thermal activation can be performed in subsequent steps after forming the two conductive films. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure which is stacked with more than three conductive films, a stacked structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can be used as the gate electrode 704.

In this embodiment, the gate electrode 704 in which tungsten with a thickness of about 170 nm is stacked over tantalum nitride with a thickness of about 30 nm is used.

Alternatively, the gate electrode 704 may be selectively formed by a droplet discharge method without the use of a mask. A droplet discharge method refers to a method for forming a predetermined pattern by discharge or ejection of a droplet containing a predetermined composition from an orifice, and includes an inkjet method in its category.

In addition, the gate electrode 704 may be formed by forming a conductive film, and the conductive film may be etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. In addition, angles and the like of the tapered shapes may also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 6C:
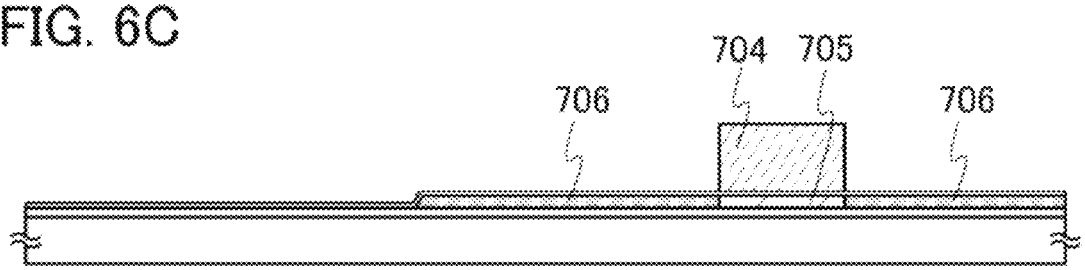

Next, as illustrated in FIG. 6C, when an impurity element which impart one conductivity is added to the semiconductor film 702 with the gate electrode 704 used as masks, a channel formation region 705 overlapping with the gate electrode 704, and a pair of impurity regions 706 between which the channel formation region 705 is provided, are formed in the semiconductor film 702.

In this embodiment, the case where an impurity element which imparts n-type conductivity (e.g., phosphorus) is added to the semiconductor film 702 is described.

Figure 6D:
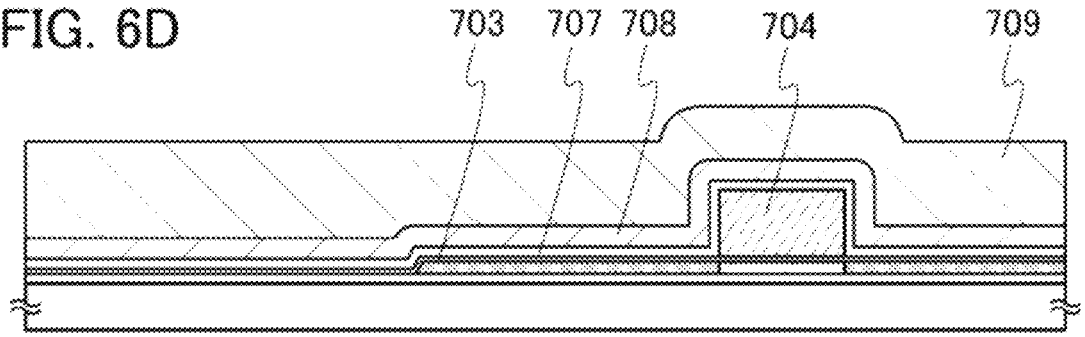

Next, as illustrated in FIG. 6D, an insulating film 707, an insulating film 708, and an insulating film 709 are formed to cover with the gate insulating film 703 and the gate electrode 704. Specifically, an inorganic insulating film of silicon oxide, silicon nitride, silicon nitride oxide, silicon oxynitride, aluminum nitride, aluminum nitride oxide, or the like can be used as the insulating film 707, the insulating film 708, and the insulating film 709. The insulating film 707, the insulating film 708, and the insulating film 709 are particularly preferably formed using a low dielectric constant (low-k) material, so that capacitance due to an overlap of electrodes or wirings can be sufficiently reduced. Note that a porous insulating film including such a material may be employed as the insulating film 707, the insulating film 708, and the insulating film 709. Since the porous insulating film has lower dielectric constant than a dense insulating layer, parasitic capacitance due to electrodes or wirings can be further reduced.

In this embodiment, an example in which a 50-nm-thick silicon oxynitride film is used for the insulating film 707, a 100-nm-thick silicon nitride oxide film is used for the insulating film 708, and a 450-nm-thick silicon oxynitride film is used as the insulating film 709 is described. In addition, although an example in which the insulating film 707, the insulating film 708, and the insulating film 709 are formed over the gate electrode 704, is described in this embodiment, only one insulating film or two insulating films may be formed over the gate electrode 704, or a plurality of insulating films of four or more layers may be stacked.

Figure 7A:
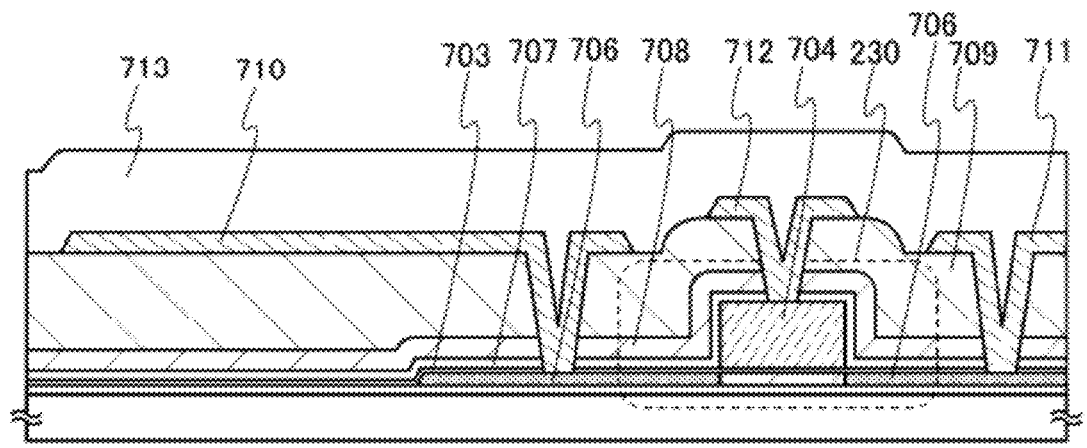
FIGS. 7A to 7C illustrate a method for manufacturing a memory device.

Next, as illustrated in FIG. 7A, an opening portion is formed in the gate insulating film 703, the insulating film 707, the insulating film 708, and the insulating film 709 by etching or the like in order to expose part of the impurity regions 706 and part of the gate electrode 704; then, a conductive film 710 and a conductive film 711 which are in contact with the pair of the impurity regions 706, and a conductive film 712 which is in contact with the gate electrode 704, are formed. In addition, an insulating film 713 is formed over the insulating film 709 so as to cover the conductive films 710 to 712.

As the conductive film which serves as the conductive films 710 to 712, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 710 to 712 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

Further alternatively, for the conductive film serving as the conductive films 710 to 712, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In this embodiment, a conductive film in which a titanium film with a thickness of about 50 nm, an aluminum film with a thickness of about 200 nm, and a titanium film with a thickness of about 100 nm are stacked is used for the conductive films 710 to 712.

The insulating film 713 may have either a single layer structure or a stacked layer of two layers or more, and preferably has a highly planar surface. As the insulating film 713, silicon oxide, silicon nitride, silicon oxynitride, or silicon nitride oxide can be used, for example. The insulating film 713 can be formed by a CVD method such as a plasma enhanced CVD method, a photo CVD method, or a thermal CVD method.

Further, as the insulating film 713, a silicon oxide film formed of organosilane by chemical vapor deposition can be used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), or the like can be used. It is needless to say that silicon oxide, silicon oxynitride, silicon nitride, silicon nitride oxide, or the like may be formed using inorganic silane such as monosilane, disilane, or trisilane.

In this embodiment, the insulating film 713 having a thickness of about 1.5 μm and including silicon oxide is formed using TEOS.

Through the above process, a transistor 230 included in the driver circuit can be formed. The transistor 230 includes the semiconductor film 702, the gate insulating film 703 provided over the semiconductor film 702, the gate electrode 704 formed to overlap with the semiconductor film 702 over the gate insulating film 703, and the conductive film 710 and the conductive film 711 which function as a source electrode and a drain electrode and are connected to the impurity region 706 included in the semiconductor film 702.

Figure 7B:
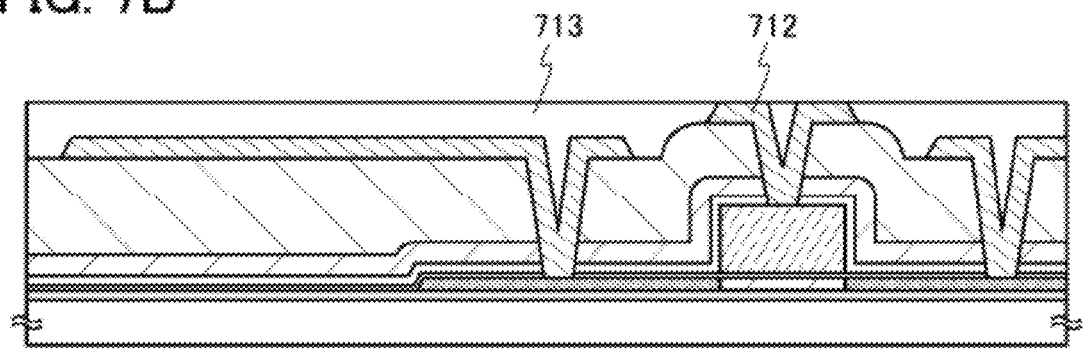

Next, as illustrated in FIG. 7B, the insulating film 713 is subjected to CMP (chemical mechanical polishing) or etching, so that surface of the conductive film 712 is exposed. Note that in order to improve the characteristics of the transistor 109 which is formed later, a surface of the insulating film 713 is preferably flattened as much as possible.

Figure 7C:
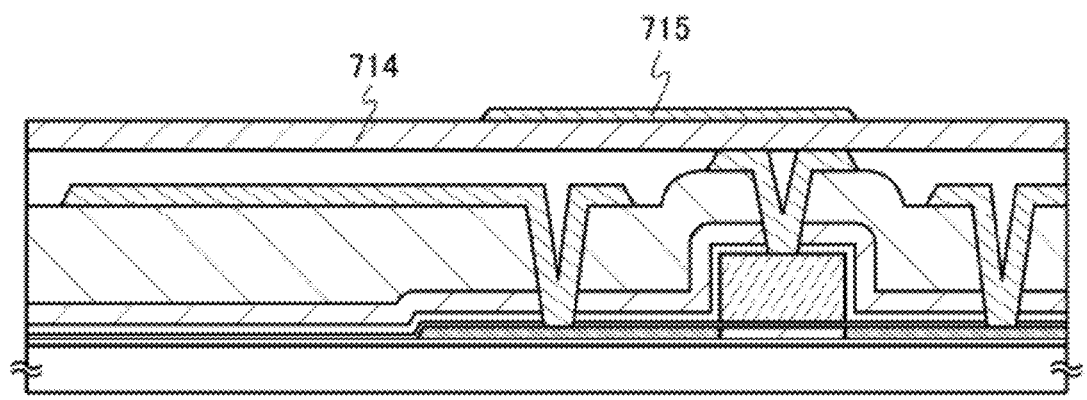

Next, a method for forming the transistor 109 is described. First, as illustrated in FIG. 7C, an oxide semiconductor film 715 is formed over the insulating film 714 after an insulating film 714 is formed over the insulating film 713 and the conductive film 712.

The insulating film 714 can be formed with the use of the same material as the insulating film 707 to the insulating film 709. In this embodiment, a silicon oxynitride film having a thickness of about 300 nm is used for the insulating film 714.

The oxide semiconductor film 715 can be formed by processing an oxide semiconductor film formed over the insulating film 714 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached to the surface of the insulating film 714 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may include silicon.

In this embodiment, as the oxide semiconductor film, an In—Ga—Zn-based oxide semiconductor thin film with a thickness of 30 nm, which is obtained by a sputtering method using a target including indium (In), gallium (Ga), and zinc (Zn), is used. As the above target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is 90% or higher and 100% or lower, and preferably 95% or higher and lower than 100%. With the use of the target with high filling rate, a dense oxide semiconductor film is formed.

Note that in the case where an In—Zn-based material is used as an oxide semiconductor film, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, when an atomic ratio of In:Zn:O=X:Y:Z in a target used for formation of an In—Zn-based oxide semiconductor, the relation Z>1.5X+Y is satisfied. The mobility can be improved by keeping the ratio of Zn within the above range.

In the case of forming a film of an In—Sn—Zn-based oxide semiconductor film as an oxide semiconductor film by a sputtering method, it is preferable to use an In—Sn—Zn—O target having an atomic ratio of In:Sn:Zn=1:1:1, 2:1:3, 1:2:2, or 20:45:35.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. at the deposition. By depositing the oxide semiconductor film in a state where the substrate is heated, the concentration of impurities included in the deposited oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film deposited in the treatment chamber can be reduced.

As one example of the deposition condition, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1 \times 10^{-10}$ Pa·m$^3$/second, entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating film 714 are formed in a preheating chamber of a sputtering apparatus, as pretreatment for deposition.

The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 716, 717, and 718 are formed before the deposition of a gate insulating film 719.

Note that etching for forming the oxide semiconductor film 715 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 715 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attaches onto surfaces of the oxide semiconductor film 715 and the insulating film 714 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In an embodiment of the present invention, in order to reduce impurities such as moisture or hydrogen in the oxide semiconductor film (dehydration or dehydrogenation), the oxide semiconductor film 715 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system).

By subjection the oxide semiconductor film 715 to heat treatment, moisture or hydrogen in the oxide semiconductor film 715 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not an element included in an oxide semiconductor. Alkali metal, in particular, Na becomes Na+ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or a reduction in mobility, occurs. In addition, variation in characteristics also occurs.

Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $1\times10^{18}/cm^3$, preferably less than or equal to $1\times10^{17}/cm^3$, the concentration of the above impurity is preferably reduced.

Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

Through the above process, the concentration of hydrogen in the oxide semiconductor film 715 can be reduced and the oxide semiconductor film 715 can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, the transistor can be manufactured using a large-sized substrate, so that the productivity can be increased. In addition, by using the oxide semiconductor film in which the hydrogen concentration is reduced and the purity is improved, it is possible to manufacture a transistor with high withstand voltage and an extremely low off-state current. The above heat treatment can be performed at any time after the oxide semiconductor film is formed.

Note that the oxide semiconductor film may be amorphous or may have crystallinity. As an oxide semiconductor film having crystallinity, a CAAC-OS film (c axis aligned crystal oxide semiconductor film) including a crystal with c-axis orientation (also referred to as CAAC) is also preferable because the effect of improving the reliability of a transistor can be obtained.

Sputtering may be performed to form an oxide semiconductor film including a CAAC-OS film. In order to obtain a CAAC-OS film by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal direction (vector) of the surface where the CAAC-OS film is formed or a normal direction (vector) of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Figure 8A:
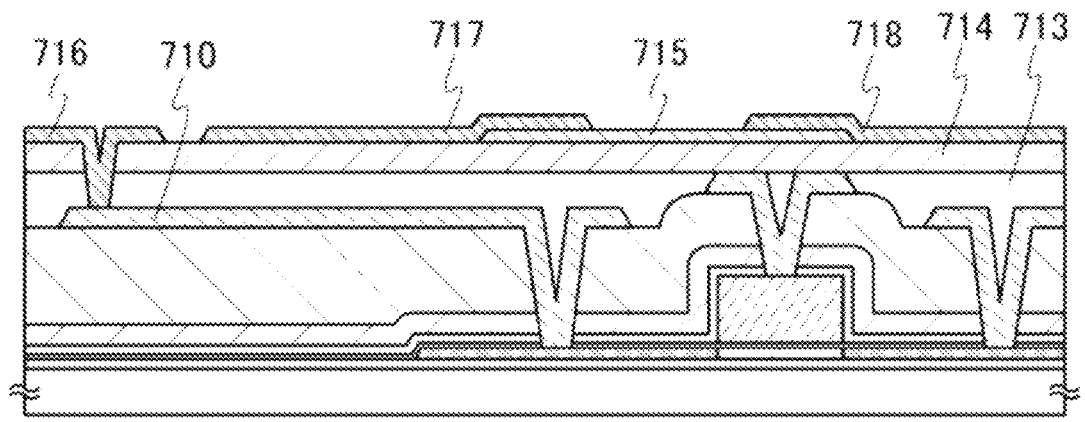
FIGS. 8A to 8C illustrate the method for manufacturing a memory device.

Next as illustrated in FIG. 8A, part of the conductive film 710 is exposed by formation of an opening by etching or the like in the insulating film 713 and the insulating film 714, and then the conductive film 716 in contact with the conductive film 710 in the opening, and the conductive film 717 and the conductive film 718 in contact with the oxide semiconductor film 715 are formed. The conductive film 717 and the conductive film 718 function as a source and drain electrodes.

Specifically, the conductive films 716, 717, and 718 can be formed as follows: a conductive film is formed over the insulating film 714 by sputtering or vacuum evaporation so as to cover the opening, and then, the conductive film is processed (patterned) into the predetermined shape.

As the conductive film which serves as the conductive films 716, 717, and 718, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 716, 717, and 718 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 716, 717, and 718, a layered structure is employed in which a conductive film including a Cu—Mg—Al alloy, a Mo—Ti alloy, Ti, or Mo is used for the lower layer and a conductive film including Cu is used for the upper layer; thus, the adhesiveness between an insulating film 714 which is an oxide film and the conductive films 716, 717, and 718 can be increased.

For the conductive film which serves as the conductive films 716, 717, and 718, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

In this embodiment, each of the conductive films 716, 717, and 718 is a 150-nm-thick tungsten film.

Note that each material and etching conditions are adjusted as appropriate so that the oxide semiconductor film 715 is not removed as much as possible at the time of etching the conductive film. Depending on the etching conditions, an exposed portion of the oxide semiconductor film 715 is partly etched, so that a groove (a depression portion) is formed in some cases.

In this embodiment, a tungsten film is used for the conductive films 716, 717, and 718. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing tetrafluoride ($CF_4$), chlorine ($Cl_2$), oxygen, or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns.

Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor film 715 and the conductive films 717 and 718 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 717 and 718 may be performed concurrently.

With provision of the oxide conductive film functioning as a source region and a drain region, resistance between the oxide semiconductor film 715 and the conductive films 717 and 718 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor film is removed. Plasma treatment may be performed using a mixture gas of oxygen and argon as well.

Figure 8B:
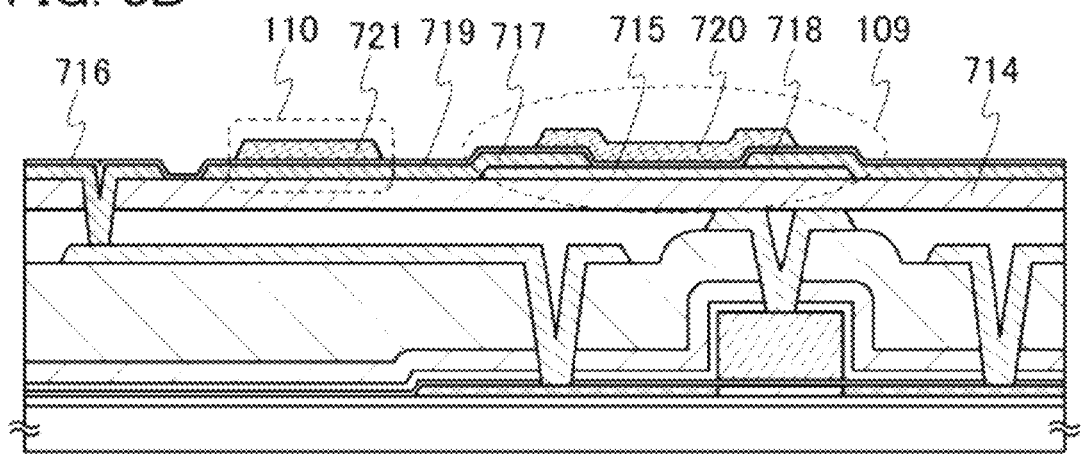

After the plasma treatment, as illustrated in FIG. 8B, the gate insulating film 719 is formed so as to cover the conductive films 716, 717, and 718 and the oxide semiconductor film 715. Then, a gate electrode 720 is formed over the gate insulating film 719 so as to overlap with the oxide semiconductor film 715, and a conductive film 721 is formed over the conductive film 719 so as to overlap with the conductive film 717.

The gate insulating film 719 can be formed using a material and a layered structure which are similar to those of the gate insulating film 703. Note that the gate insulating film 719 preferably includes impurities such as moisture or hydrogen as little as possible, and the gate insulating film 719 may be formed using a single-layer insulating film or a plurality of insulating films stacked. When hydrogen is contained in the gate insulating film 719, hydrogen enters the oxide semiconductor film 715 or oxygen in the oxide semiconductor film 715 is extracted by hydrogen, whereby the oxide semiconductor film 715 has lower resistance (n-type conductivity); thus, a parasitic channel might be formed. Thus, it is important that a deposition method in which hydrogen is not used be employed in order to form the gate insulating film 719 containing hydrogen as little as possible. A material having a high barrier property is preferably used for the gate insulating film 719. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor film 715 than the insulating film having a high barrier property. Then, the insulating film having a high barrier property is formed so as to overlap with the conductive films 716, 717, and 718 and the oxide semiconductor film 715 with the insulating film having low proportion of nitrogen sandwiched therebetween. When the insulating film having a high barrier property is used, impurities such as moisture or hydrogen can be prevented from entering the oxide semiconductor film 715, the gate insulating film 719, or the interface between the oxide semiconductor film 715 and another insulating film and the vicinity thereof. In addition, the insulating film having low proportion of nitrogen, such as a silicon oxide film or a silicon oxynitride film, is formed so as to be in contact with the oxide semiconductor film 715, so that the insulating film having a high barrier property can be prevented from being in direct contact with the oxide semiconductor film 715.

In this embodiment, a silicon nitride film with a thickness of 30 nm which is formed by a sputtering method is used as the gate insulating film 719. The substrate temperature at deposition may be higher than or equal to room temperature and lower than or equal to 400° C. and in this embodiment, is 300° C.

After the gate insulating film 719 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment is performed at 250° C. in a nitrogen atmosphere for 1 hour. Alternatively, RTA treatment for a short time at a high temperature may be performed before the formation of the conductive films 716, 717, and 718 in a manner similar to that of the heat treatment performed on the oxide semiconductor film for reduction of moisture or hydrogen. Even when oxygen defects are generated in the oxide semiconductor film 715 by the heat treatment performed on the oxide semiconductor film 715 by performing heat treatment after provision of the gate insulating film 719 containing oxygen, oxygen is supplied to the oxide semiconductor film 715 from the gate insulating film 719. By the supply of oxygen to the oxide semiconductor film 715, oxygen defects that serve as donors can be reduced in the oxide semiconductor film 715 and the stoichiometric composition can be satisfied. As a result, the oxide semiconductor film 715 can be substantially intrinsic and variation in electrical characteristics of the transistor due to oxygen defects can be reduced; thus, electrical characteristics can be improved. The timing of this heat treatment is not particularly limited as long as it is after the formation of the gate insulating film 719. When this heat treatment serves as heat treatment in another step (e.g., heat treatment at the time of formation of a resin film or heat treatment for lowering the resistance of a transparent conductive film), the oxide semiconductor film 715 can be made to be substantially intrinsic without the increase in the number of steps.

Alternatively, the oxygen defects that serve as donors in the oxide semiconductor film 715 may be reduced by subjecting the oxide semiconductor film 715 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 715 by an ion implantation method, an ion doping method, or the like so that oxygen defects that serve as donors are reduced. For example, oxygen made to be plasma with a microwave of 2.45 GHz may be added to the oxide semiconductor film 715.

The gate electrode 720 and the conductive film 721 can be formed in such a manner that a conductive film is formed over the gate insulating film 719 and then is patterned. The gate electrode 720 and the conductive film 721 can be formed using a material and a layered structure which are similar to those of the gate electrode 704 and the conductive films 716, 717, and 718.

The thickness of each of the gate electrode 720 and the conductive film 721 is 10 nm to 400 nm, preferably 100 nm to 300 nm. In this embodiment, after a conductive film with a thickness of 150 nm for the gate electrode is formed by a sputtering method using a tungsten target, the conductive film is processed (patterned) into a desired shape by etching, whereby the gate electrode 720 and the conductive film 721 are formed. Note that a resist mask may be formed by an inkjet method. Formation of the resist mask by an inkjet method needs no photomask; thus, manufacturing cost can be reduced.

Through the above steps, the transistor 109 is formed.

Note that a portion where the conductive film 717 and the conductive film 721 overlap with each other with the gate insulating film 719 provided therebetween corresponds to the capacitor 110.

In this embodiment, an example of the parallel plate capacitor 110 is shown but a stacked capacitor may be used in the memory device according to an embodiment of the present invention.

Although the transistor 109 is described as a single-gate transistor, a multi-gate transistor including a plurality of channel formation regions can be formed when a plurality of gate electrodes which are electrically connected are included when needed.

Note that an insulating film which is in contact with the oxide semiconductor film 715 (in this embodiment, corresponding to the insulating film 714 and the gate insulating film 719) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor film, the state of an interface with the oxide semiconductor film can be kept well.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material including gallium oxide may be used as an insulating film, so that favorable characteristics can be kept at the interface between the oxide semiconductor film and the insulating film. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor film.

The insulating film which is in contact with the oxide semiconductor film 715 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor film 715 is formed using gallium oxide, the composition of gallium oxide can be set to be $Ga_2O_x$ ($X=3+\alpha$, $0<\alpha<1$) by heat treatment in an oxygen atmosphere or oxygen doping.

In the case where the insulating film which is in contact with the oxide semiconductor film 715 is formed using aluminum oxide, the composition of aluminum oxide can be set to be $Al_2O_x$ ($X=3+\alpha$, $0<\alpha<1$) by heat treatment in an oxygen atmosphere or oxygen doping.

In the case where the insulating film which is in contact with the oxide semiconductor film 715 is formed using gallium aluminum oxide (aluminum gallium oxide), the composition of gallium aluminum oxide (aluminum gallium oxide) can be set to be $Ga_xAl_{2-x}O_{3+a}$ ($0<X<2$, $0<a<1$) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor film 715; however, it is preferable to apply such an insulating film to both the insulating films which are in contact with the oxide semiconductor film 715. The above effect can be enhanced with a structure where the oxide semiconductor film 715 is provided between the insulating films each including a region where the proportion of oxygen is higher than that in the stoichiometric composition, which are used as the insulating films in contact with the oxide semiconductor film 715 and positioned on the upper side and the lower side of the oxide semiconductor film 715.

The insulating films on the upper side and the lower side of the oxide semiconductor film 715 may contain the same constituent element or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film which is in contact with the oxide semiconductor film 715 may be formed by a stack of insulating films each including a region where the proportion of oxygen is higher than that in the stoichiometric composition. For example, the insulating film on the upper side of the oxide semiconductor film 715 may be formed as follows: gallium oxide whose composition is $Ga_2O_x$ ($X=3+\alpha$, $0<\alpha<1$) is formed and gallium aluminum oxide (aluminum gallium oxide) whose composition is $Ga_xAl_{2-x}O_{3+\alpha}$ (0<X<2, 0<α<1) may be formed thereover. Note that the insulating film on the lower side of the oxide semiconductor film 715 may be formed by a stack of insulating films each including a region where the proportion of oxygen is higher than that in the stoichiometric composition. Alternatively, both the insulating films on the upper side and the lower side of the oxide semiconductor film 715 may be formed by a stack of insulating films each including a region where the proportion of oxygen is higher than that in the stoichiometric composition.

Figure 8C:
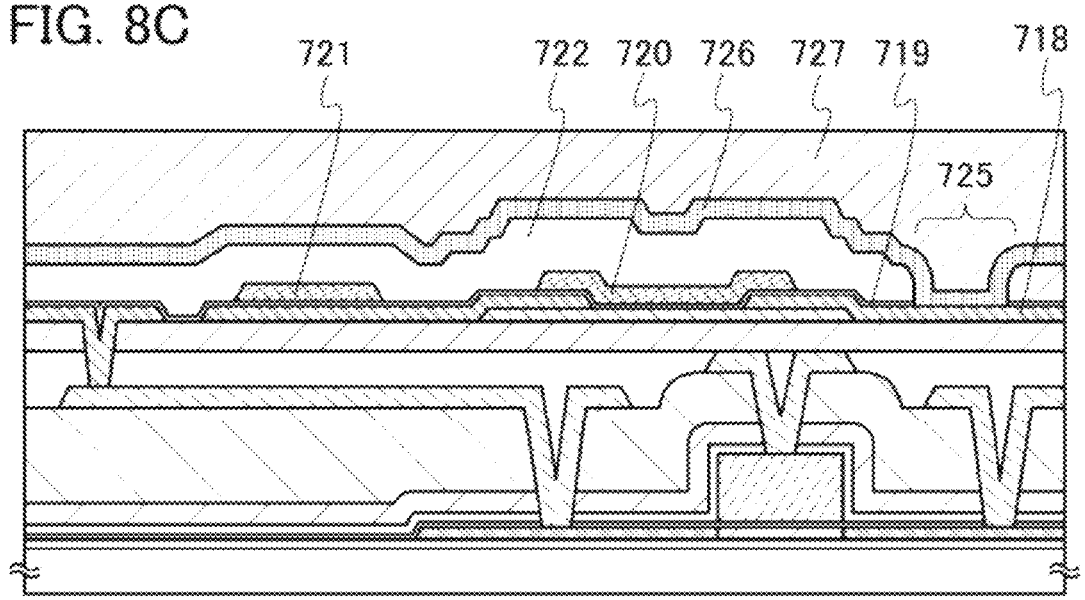

Next, as illustrated in FIG. 8C, an insulating film 722 is formed so as to cover the gate insulating film 719, the conductive film 721, and the gate electrode 720. The insulating film 722 can be formed by PVD, CVD, or the like. The insulating film 722 can be formed using a material including an inorganic insulating material such as silicon oxide, silicon oxynitride, silicon nitride, hafnium oxide, gallium oxide, or aluminum oxide. Note that for the insulating film 722, a material with a low dielectric constant or a structure with a low dielectric constant (e.g., a porous structure) is preferably used. When the dielectric constant of the insulating film 722 is lowered, parasitic capacitance generated between wirings or electrodes can be reduced, which results in higher speed operation. Note that although the insulating film 722 has a single-layer structure in this embodiment, an embodiment of the present invention is not limited to this structure. The insulating film 722 may have a layered structure of two or more layers.

Next, an opening 725 is formed in the gate insulating film 719 and the insulating film 722, so that part of the conductive film 718 is exposed. After that, a wiring 726 which is in contact with the conductive film 718 through the opening 725 is formed over the insulating film 722.

A conductive film is formed by PVD or CVD and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

In this embodiment, as the wiring 726, a conductive film formed as follows is used: by a sputtering method, a titanium film with a thickness of about 50 nm, an aluminum film with a thickness of about 200 nm, and a titanium film with a thickness of about 50 nm are sequentially stacked. Here, the titanium film formed has a function of reducing an oxide film (e.g., a native oxide film) formed on the surface over which the titanium film is formed, to decrease the contact resistance with the lower electrode or the like (here, the conductive film 718). With the titanium film, hillock of aluminum film can be prevented. A copper film may be formed by a plating method after the formation of the barrier film of titanium, titanium nitride, or the like.

Next, an insulating film 727 is formed so as to cover the wiring 726. Through the series of steps, the memory device can be manufactured.

Note that in the manufacturing method, the conductive films 717 and 718 functioning as source and drain electrodes are formed after the formation of the oxide semiconductor film 715. Thus, as illustrated in FIG. 8B, in the transistor 109 obtained by the manufacturing method, the conductive films 717 and 718 are formed over the oxide semiconductor film 715. However, in the transistor 109, the conductive films functioning as source and drain electrodes may be formed below the oxide semiconductor film 715, that is, between the oxide semiconductor film 715 and the insulating film 714.

This embodiment can be implemented by being combined as appropriate with any of the above embodiments.

(Embodiment 5)

In this embodiment, a transistor which includes an oxide semiconductor film and has a structure different from those in Embodiments 4 will be described.

Figure 9A:
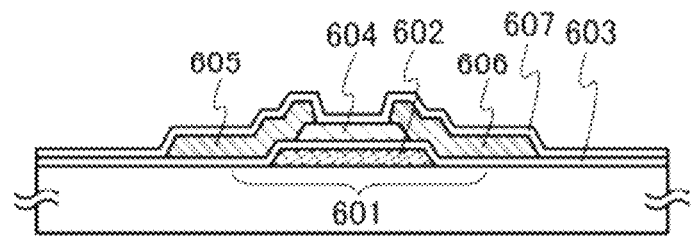
FIGS. 9A to 9D each illustrate a structure of a transistor.

A transistor 601 illustrated in FIG. 9A is a bottom gate transistor having a channel-etched structure.

The transistor 601 includes a gate electrode 602 formed over an insulating surface, a gate insulating film 603 over the gate electrode 602, an oxide semiconductor film 604 which is over the gate insulating film 603 and overlaps with the gate electrode 602, and a conductive film 605 and a conductive film 606 formed over the oxide semiconductor film 604. The transistor 601 may further include an insulating film 607 formed over the oxide semiconductor film 604 and the conductive film 605 and the conductive film 606.

Note that the transistor 601 illustrated in FIG. 9A may further include a back-gate electrode which is over the insulating film 607 and which is present in a portion overlapping with the oxide semiconductor film 604.

Figure 9B:
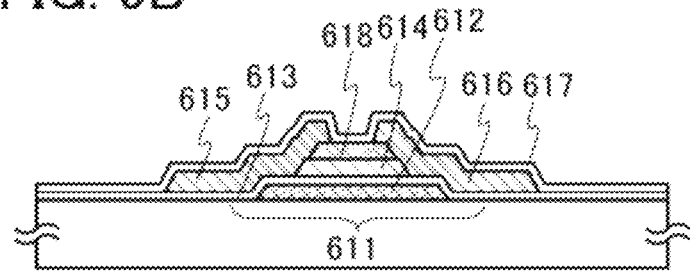

A transistor 611 illustrated in FIG. 9B is a channel-protective bottom-gate transistor.

The transistor 611 includes a gate electrode 612 formed over an insulating surface, a gate insulating film 613 over the gate electrode 612, an oxide semiconductor film 614 which is over the gate insulating film 613 and overlaps with the gate electrode 612, a channel protective film 618 formed over the oxide semiconductor film 614, and a conductive film 615 and a conductive film 616 formed over the oxide semiconductor film 614. The transistor 611 may further include an insulating film 617 formed over the channel protective film 618, the conductive film 615, and the conductive film 616.

The transistor 611 illustrated in FIG. 9B may further include a back-gate electrode formed over the insulating film 617 in a portion which overlaps with the oxide semiconductor film 614.

The channel protective film 618 can prevent the portion of the oxide semiconductor film 614, which serves as a channel formation region, from being damaged in a subsequent step (for example, a reduction in thickness due to plasma or an etchant in etching). Consequently, reliability of the transistor 611 can be improved.

Figure 9C:
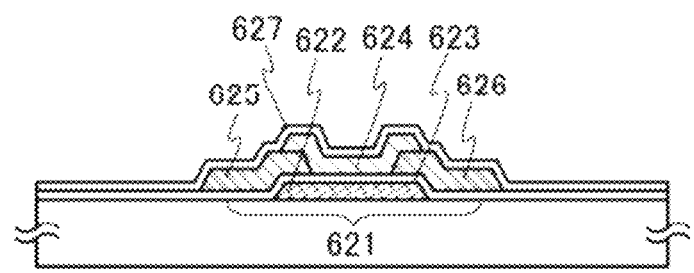

A transistor 621 illustrated in FIG. 9C is a bottom-contact bottom-gate transistor.

The transistor 621 includes a gate electrode 622 over an insulating surface; a gate insulating film 623 over the gate electrode 622; a conductive film 625 and a conductive film 626 over the gate insulating film 623; and an oxide semiconductor film 624 which overlaps with the gate insulating film 623 and overlaps with the gate electrode 622 and which is formed over the conductive film 625 and the conductive film 626. The transistor 621 may further include an insulating film 627 formed over the conductive film 625, the conductive film 626, and the oxide semiconductor film 624.

The transistor 621 illustrated in FIG. 9C may further include a back-gate electrode formed over the insulating film 627 in a portion which overlaps with the oxide semiconductor film 624.

Figure 9D:
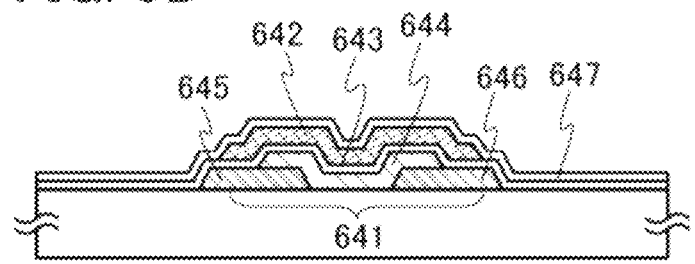

A transistor 641 illustrated in FIG. 9D is a bottom-contact top-gate transistor.

The transistor 641 includes conductive films 645 and 646 formed over an insulating surface; an oxide semiconductor film 644 formed over conductive films 645 and 646; a gate insulating film 643 formed over the oxide semiconductor film 644, the conductive film 645, and the conductive film 646; a gate electrode 642 which overlaps with the oxide semiconductor film 644, over the gate insulating film 643. Further, the transistor 641 may include an insulating film 647 formed over the gate electrode 642.

This embodiment can be implemented by being combined as appropriate with any of the above embodiments.

(Embodiment 6)

In this embodiment, a transistor which includes an oxide semiconductor film and has a structure different from those in Embodiments 4 and 5 will be described.

Figure 10A:
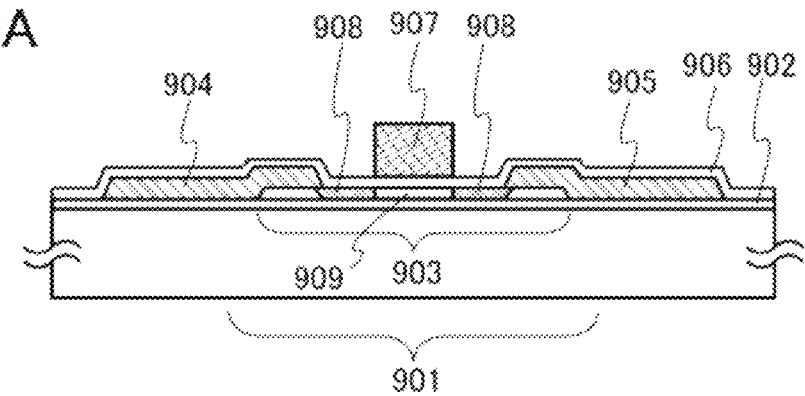
FIGS. 10A to 10D each illustrate a structure of a transistor.

A transistor 901 illustrated in FIG. 10A includes an oxide semiconductor film 903 which is formed over an insulating film 902 and functions as an active layer; a source electrode 904 and a drain electrode 905 which are formed over the oxide semiconductor film 903; a gate insulating film 906 which is formed over the oxide semiconductor film 903, the source electrode 904, and the drain electrode 905; and a gate electrode 907 overlaps with the oxide semiconductor film 903, over the gate insulating film 906.

The transistor 901 illustrated in FIG. 10A is a top-gate transistor in which the gate electrode 907 is formed over the oxide semiconductor film 903, and a top-contact transistor in which the source electrode 904 and the drain electrode 905 are formed over the oxide semiconductor film 903. In the transistor 901, the source electrode 904 and the drain electrode 905 do not overlap with the gate electrode 907. That is to say, a distance larger than the thickness of the gate insulating film 906 is provided between the gate electrode 907, and the source electrode 904 or the drain electrode 905. Therefore, in the transistor 901, parasitic capacitance generated between the gate electrode 907, and the source electrode 904 or the drain electrode 905 can be small, so that high-speed operation can be achieved.

The oxide semiconductor film 903 includes a pair of high concentration regions 908, which is obtained by adding a dopant imparting n-type conductivity to the oxide semiconductor film 903 after formation of the gate electrode 907. Further, in the oxide semiconductor film 903, a region which overlaps with the gate electrode 907 with the gate insulating film 906 provided therebetween is a channel formation region 909. In the oxide semiconductor film 903, the channel formation region 909 is provided between the pair of high concentration regions 908. Ion implantation can be used for addition of the dopant, which is performed to form the high concentration region 908. A rare gas such as helium, argon, and xenon; an atom belonging to Group 15, such as nitrogen, phosphorus, arsenic, and antimony; or the like can be used as the dopant.

For example, when nitrogen is used as the dopant, it is preferable that the high concentration regions 908 have a nitrogen atom concentration higher than or equal to $5\times10^{19}$/cm$^3$ and lower than or equal to $1\times10^{22}$/cm$^3$.

The high concentration regions 908 to which the dopant imparting n-type conductivity is added has higher conductivity than other regions in the oxide semiconductor film 903. Thus, the high concentration regions 908 are provided in the oxide semiconductor film 903, whereby a resistance between the source electrode 904 and the drain electrode 905 can be reduced.

When an In—Ga—Zn-based oxide semiconductor is used for the oxide semiconductor film 903, heat treatment is performed for approximately 1 hour at a temperature higher than or equal to 300° C. and lower than or equal to 600° C. after the addition of nitrogen, so that an oxide semiconductor in the high concentration regions 908 has a wurtzite crystal structure. When the oxide semiconductor in the high concentration regions 908 has a wurtzite crystal structure, the conductivity of the high concentration regions 908 can be further increased and the resistance between the source electrode 904 and the drain electrode 905 can be further reduced. Note that in order to effectively reduce the resistance between the source electrode 904 and the drain electrode 905 by forming the oxide semiconductor having a wurtzite crystal structure, when nitrogen is used as the dopant, the nitrogen atom concentration in the high concentration regions 908 is preferably higher than or equal to $1\times10^{20}$/cm$^3$ and lower than or equal to 7 atoms %. However, even when the nitrogen atom concentration is lower than the above range, the oxide semiconductor having a wurtzite crystal structure can be obtained in some cases.

Further, the oxide semiconductor film 903 may be a CAAC-OS film. In that case, the conductivity of the oxide semiconductor film 903 can be high as compared to that in the case of an amorphous semiconductor film; therefore, the resistance between the source electrode 904 and the drain electrode 905 can be reduced.

The reduction in the resistance between the source electrode 904 and the drain electrode 905 ensures a high on-state current and high-speed operation even when the transistor 901 is miniaturized. Further, the miniaturization of the transistor 901 makes it possible to reduce an area occupied by a memory cell and increase memory capacitance per unit area of a cell array.

Figure 10B:
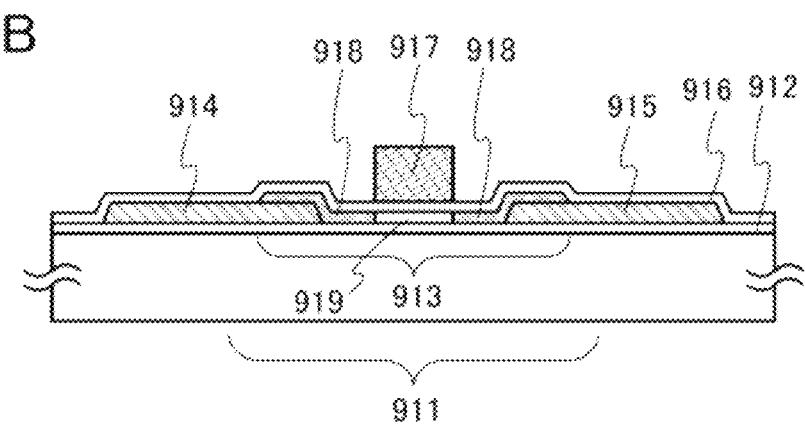

A transistor 911 illustrated in FIG. 10B includes a source electrode 914 and a drain electrode 915 which are formed over an insulating film 912; an oxide semiconductor film 913 which is formed over the source electrode 914 and the drain electrode 915 and functions as an active layer; a gate insulating film 916 over the oxide semiconductor film 913, the source electrode 914, and the drain electrode 915; and a gate electrode 917 over the gate insulating film 916, provided in a position overlapping with the oxide semiconductor film 913.

The transistor 911 illustrated in FIG. 10B is a top-gate transistor in which the gate electrode 917 is formed over the oxide semiconductor film 913, and is a bottom-contact transistor in which the source electrode 914 and the drain electrode 915 are formed below the oxide semiconductor film 913. In a similar manner to the transistor 901, the source electrode 914 and the drain electrode 915 do not overlap with the gate electrode 917 in the transistor 911. Thus, parasitic capacitances formed between the source electrode 914 and the gate electrode 917 and between the drain electrode 915 and the gate electrode 917 can be reduced and high-speed operation can be achieved.

In addition, the oxide semiconductor film 913 includes a pair of high concentration regions 918 which is obtained by addition of a dopant imparting n-type conductivity to the oxide semiconductor film 913 after the gate electrode 917 is formed. Further, in the oxide semiconductor film 913, a region which overlaps with the gate electrode 917 with the gate insulating film 916 provided therebetween is a channel formation region 919. A channel formation region 919 is provided between the pair of high concentration regions 918 in the oxide semiconductor film 913.

The high concentration regions 918 can be formed by an ion implantation method in a similar manner to the case of the high concentration regions 908 included in the transistor 901. The case of the high concentration regions 908 can be referred to for kinds of dopant for forming the high concentration regions 918.

For example, when nitrogen is used as the dopant, it is preferable that the high concentration regions 918 have a nitrogen atom concentration higher than or equal to $5\times10^{19}/\text{cm}^3$ and lower than or equal to $1\times10^{22}/\text{cm}^3$.

The high concentration regions 918 to which the dopant imparting n-type conductivity is added has higher conductivity than other regions in the oxide semiconductor film 913. Thus, the high concentration regions 918 are included in the oxide semiconductor film 913, which results in a reduction in resistance between the source electrode 914 and the drain electrode 915.

When an In—Ga—Zn-based oxide semiconductor is used for the oxide semiconductor film 913, heat treatment is performed at a temperature higher than or equal to 300° C. and lower than or equal to 600° C. after the addition of nitrogen, so that an oxide semiconductor in the high concentration regions 918 has a wurtzite crystal structure. When the oxide semiconductor in the high concentration regions 918 has a wurtzite crystal structure, the conductivity of the high concentration regions 918 can be further increased and the resistance between the source electrode 914 and the drain electrode 915 can be further reduced. Note that in order to effectively reduce the resistance between the source electrode 914 and the drain electrode 915 by forming the oxide semiconductor having a wurtzite crystal structure, when nitrogen is used as a dopant, the nitrogen atom concentration in the high concentration regions 918 is preferably higher than or equal to $1\times10^{20}/\text{cm}^3$ and lower than or equal to 7 atoms %. However, even when the nitrogen atom concentration is lower than the above range, the oxide semiconductor having a wurtzite crystal structure can be obtained in some cases.

Further, the oxide semiconductor film 913 may be a CAAC-OS film. In that case, the conductivity of the oxide semiconductor film 913 can be high as compared to that in the case of an amorphous semiconductor film, and thus the resistance between the source electrode 914 and the drain electrode 915 can be reduced.

The reduction in the resistance between the source electrode 914 and the drain electrode 915 ensures a high on-state current and high-speed operation even when the transistor 911 is miniaturized. Further, the miniaturization of the transistor 911 makes it possible to reduce an area occupied by a memory cell and increase memory capacity per unit area of a cell array.

Figure 10C:
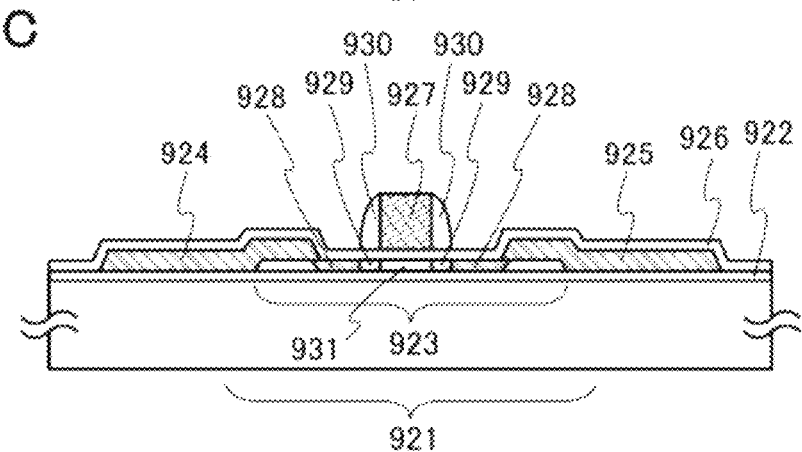

A transistor 921 illustrated in FIG. 10C includes an oxide semiconductor film 923 which is formed over an insulating film 922 and functions as an active layer; a source electrode 924 and a drain electrode 925 which are formed over the oxide semiconductor film 923; a gate insulating film 926 over the oxide semiconductor film 923, the source electrode 924, and the drain electrode 925; and a gate electrode 927 over the gate insulating film 926, provided in a position overlapping with the oxide semiconductor film 923. The transistor 921 further includes sidewalls 930 provided on the side of the gate electrode 927 and formed using an insulating film.

The transistor 921 illustrated in FIG. 10C is a top-gate transistor in which the gate electrode 927 is formed over the oxide semiconductor film 923, and also is a top-contact transistor in which the source electrode 924 and the drain electrode 925 are formed over the oxide semiconductor film 923. Since the source electrode 924 and the drain electrode 925 do not overlap with the gate electrode 927 in the transistor 921 in a similar manner to the transistor 901, parasitic capacitances between the source electrode 924 and the gate electrode 927 and between the drain electrode 925 and the gate electrode 927 can be reduced and high-speed operation can be achieved.

Further, the oxide semiconductor film 923 includes a pair of high concentration regions 928 and a pair of low concentration regions 929 which can be obtained by the addition of a dopant imparting n-type conductivity to the oxide semiconductor film 923 after the gate electrode 927 is formed. Furthermore, in the oxide semiconductor film 923, a region which overlaps with the gate electrode 927 with the gate insulating film 926 provided therebetween is a channel formation region 931. In the oxide semiconductor film 923, the pair of low concentration regions 929 is provided between the pair of high concentration regions 928, and the channel formation region 931 is provided between the pair of low concentration regions 929. The pair of low concentration regions 929 is provided in regions which are included in the oxide semiconductor film 923 and overlap with the sidewalls 930 with the gate insulating film 926 provided therebetween.

The high concentration regions 928 and the low concentration regions 929 can be formed by an ion implantation method in a similar manner to the case of the high concentration regions 908 included in the transistor 901. The case of the high concentration regions 908 can be referred to for kinds of dopant for forming the high concentration regions 928.

For example, when nitrogen is used as the dopant, it is preferable that the high concentration regions 928 have a nitrogen atom concentration higher than or equal to $5\times10^{19}/\text{cm}^3$ and lower than or equal to $1\times10^{22}/\text{cm}^3$. Further, when nitrogen is used as the dopant, for example, it is preferable that the low concentration regions 929 have a nitrogen atom concentration higher than or equal to $5\times10^{18}/\text{cm}^3$ and lower than $5\times10^{19}$ cm$^3$.

The high concentration regions 928 to which the dopant imparting n-type conductivity is added have higher conductivity than other regions in the oxide semiconductor film 923. Thus, the high concentration regions 928 are provided in the oxide semiconductor film 923, which results in a reduction in resistance between the source electrode 924 and the drain electrode 925. Further, the low concentration regions 929 are provided between the channel formation region 931 and the high concentration regions 928, which results in a reduction in negative shift of a threshold voltage due to a short-channel effect.

When an In—Ga—Zn-based oxide semiconductor is used for the oxide semiconductor film 923, heat treatment is performed at a temperature higher than or equal to 300° C. and lower than or equal to 600° C. after the addition of nitrogen, so that an oxide semiconductor in the high concentration regions 928 has a wurtzite crystal structure. Further, the low concentration regions 929 may have a wurtzite crystal structure by the heat treatment depending on the concentration of the nitrogen. When the oxide semiconductor in the high concentration regions 928 has a wurtzite crystal structure, the conductivity of the high concentration regions 928 can be further increased and the resistance between the source electrode 924 and the drain electrode 925 can be further reduced. Note that in order to effectively reduce the resistance between the source electrode 924 and the drain electrode 925 by forming the oxide semiconductor having a wurtzite crystal structure, when nitrogen is used as a dopant, the nitrogen atom concentration in the high concentration regions 928 is preferably higher than or equal to $1\times10^{20}/\text{cm}^3$ and lower than or equal to 7 atoms %. However, even when the nitrogen atom concentration is lower than the above range, the oxide semiconductor having a wurtzite crystal structure can be obtained in some cases.

Further, the oxide semiconductor film 923 may be a CAAC-OS film. In that case, the conductivity of the oxide semiconductor film 923 can be high as compared to that in the case of an amorphous semiconductor film, and thus the resistance between the source electrode 924 and the drain electrode 925 can be reduced.

The reduction in the resistance between the source electrode 924 and the drain electrode 925 ensures a high on-state current and high-speed operation even when the transistor 921 is miniaturized. Further, the miniaturization of the transistor 921 makes it possible to reduce an area occupied by a memory cell and increase memory capacity per unit area of a cell array.

Figure 10D:
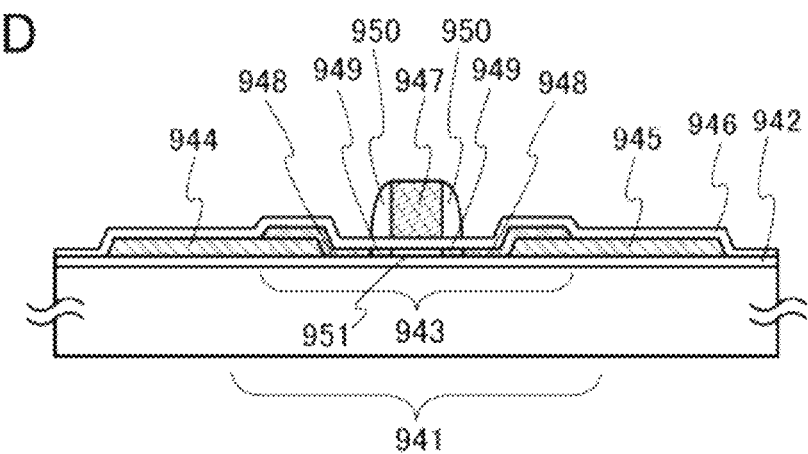

A transistor 941 illustrated in FIG. 10D includes a source electrode 944 and a drain electrode 945 which are formed over an insulating film 942; an oxide semiconductor film 943 which is formed over the source electrode 944 and the drain electrode 945 and functions as an active layer; a gate insulating film 946 over the oxide semiconductor film 943, the source electrode 944, and the drain electrode 945; and a gate electrode 947 over the gate insulating film 946, provided in a position overlapping with the oxide semiconductor film 943. The transistor 941 further includes sidewalls 950 which is provided on the side of the gate electrode 947 and formed using an insulating film.

The transistor 941 illustrated in FIG. 10D is a top-gate transistor in which the gate electrode 947 is formed over the oxide semiconductor film 943, and is a bottom-contact transistor in which the source electrode 944 and the drain electrode 945 are formed below the oxide semiconductor film 943. Since the source electrode 944 and the drain electrode 945 do not overlap with the gate electrode 947 in the transistor 941 in a similar manner to the transistor 901, parasitic capacitances between the source electrode 944 and the gate electrode 947 and between the drain electrode 945 and the gate electrode 947 can be reduced and high-speed operation can be achieved.

Further, the oxide semiconductor film 943 includes a pair of high concentration regions 948 and a pair of low concentration regions 949 which can be obtained by the addition of a dopant imparting n-type conductivity to the oxide semiconductor film 943 after the gate electrode 947 is formed. Furthermore, in the oxide semiconductor film 943, a region which overlaps with the gate electrode 947 with the gate insulating film 946 provided therebetween is a channel formation region 951. In the oxide semiconductor film 943, the pair of low concentration regions 949 is provided between the pair of high concentration regions 948, and the channel formation region 951 is provided between the pair of low concentration regions 949. The pair of low concentration regions 949 is provided in a region which is included in the oxide semiconductor film 943 and overlaps with the sidewalls 950 with the gate insulating film 946 provided therebetween.

The high concentration regions 948 and the low concentration regions 949 can be formed by an ion implantation method in a similar manner to the case of the high concentration regions 908 included in the transistor 901. The case of the high concentration regions 908 can be referred to for kinds of dopant for forming the high concentration regions 948.

For example, when nitrogen is used as the dopant, it is preferable that the high concentration regions 948 have a nitrogen atom concentration higher than or equal to $5\times10^{19}/cm^3$ and lower than or equal to $1\times10^{22}/cm^3$. Further, when nitrogen is used as the dopant, for example, it is preferable that the low concentration regions 949 have a nitrogen atom concentration higher than or equal to $5\times10^{18}/cm^3$ and lower than $5\times10^{19}$ cm$^3$.

The high concentration regions 948 to which the dopant imparting n-type conductivity is added has higher conductivity than other regions in the oxide semiconductor film 943. Thus, the high concentration regions 948 are included in the oxide semiconductor film 943, which results in a reduction in resistance between the source electrode 944 and the drain electrode 945. Further, the low concentration regions 949 are provided between the channel formation region 951 and the high concentration regions 948, which results in a reduction in negative shift of a threshold voltage due to a short-channel effect.

When an In—Ga—Zn-based oxide semiconductor is used for the oxide semiconductor film 943, heat treatment at a temperature higher than or equal to 300° C. and lower than or equal to 600° C. after the addition of nitrogen enables an oxide semiconductor in the high concentration regions 948 to include a wurtzite crystal structure. Further, the low concentration regions 949 may include a wurtzite crystal structure by the heat treatment depending on the concentration of the nitrogen. When the oxide semiconductor in the high concentration regions 948 includes a wurtzite crystal structure, the conductivity of the high concentration regions 948 can be further increased and the resistance between the source electrode 944 and the drain electrode 945 can be further reduced. Note that in order to effectively reduce the resistance between the source electrode 944 and the drain electrode 945 by forming the oxide semiconductor having a wurtzite crystal structure, when nitrogen is used as a dopant, the nitrogen atom concentration in the high concentration regions 948 is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 943 may be a CAAC-OS film. In that case, the conductivity of the oxide semiconductor film 943 can be high as compared to that in the case of an amorphous semiconductor film, and thus the resistance between the source electrode 944 and the drain electrode 945 can be reduced.

The reduction in the resistance between the source electrode 944 and the drain electrode 945 ensures a high on-state current and high-speed operation even when the transistor 941 is miniaturized. Further, the miniaturization of the transistor 941 makes it possible to reduce an area occupied by a memory cell and increase memory capacity per unit area of a cell array.

Note that, as one of methods for manufacturing high concentration regions functioning as a source region and a drain region in a transistor including an oxide semiconductor by a self-aligned process, a method is disclosed in which a surface of an oxide semiconductor film is exposed and argon plasma treatment is performed to reduce resistance of the region in the oxide semiconductor film which is exposed to plasma (S. Jeon et al. "180 nm Gate Length Amorphous InGaZnO Thin Film Transistor for High Density Image Sensor Application", *IEDM Tech. Dig.*, p. 504, 2010).

However, in the manufacturing method, a gate insulating film needs to be partly removed after formation of the gate insulating film so that portions which are to serve as the source region and the drain region are exposed. At the time of partly removing the gate insulating film, part of an oxide semiconductor film below the gate insulating film is over-etched, so that the thicknesses of the portions which are to serve as the source region and the drain region are reduced. As a result, the resistance of the source region and the drain region is increased, and characteristic defect due to the over etching is likely to occur.

To miniaturize a transistor, it is necessary to employ a dry etching method with high processing accuracy. However, the above over etching is more likely to occur when a dry etching method which does not sufficiently ensure selectivity between the oxide semiconductor film and the gate insulating film.

For example, no problem is caused when the oxide semiconductor film has a sufficient thickness, but in the case where a channel length is 200 nm or less, it is necessary that a portion of the oxide semiconductor film, which is to serve as a channel formation region, be 20 nm or less, preferably 10 nm or less, in order to prevent a short-channel effect. When such a thin oxide semiconductor film is used, the over etching of the oxide semiconductor film is not preferable because the over etching causes a characteristic defect of the transistor, as described above.

However, when a dopant is added to the oxide semiconductor in the state where the oxide semiconductor film is not exposed and a gate insulating film remains, as described in an embodiment of the present invention, the over etching of the oxide semiconductor film can be prevented and excessive damage to the oxide semiconductor film can be reduced. In addition, an interface between the oxide semiconductor film and the gate insulating film is kept clean. Consequently, characteristics and reliability of the transistor can be improved.

This embodiment can be implemented by being combined as appropriate with any of the above embodiments.

(Embodiment 7)

Figure 12:
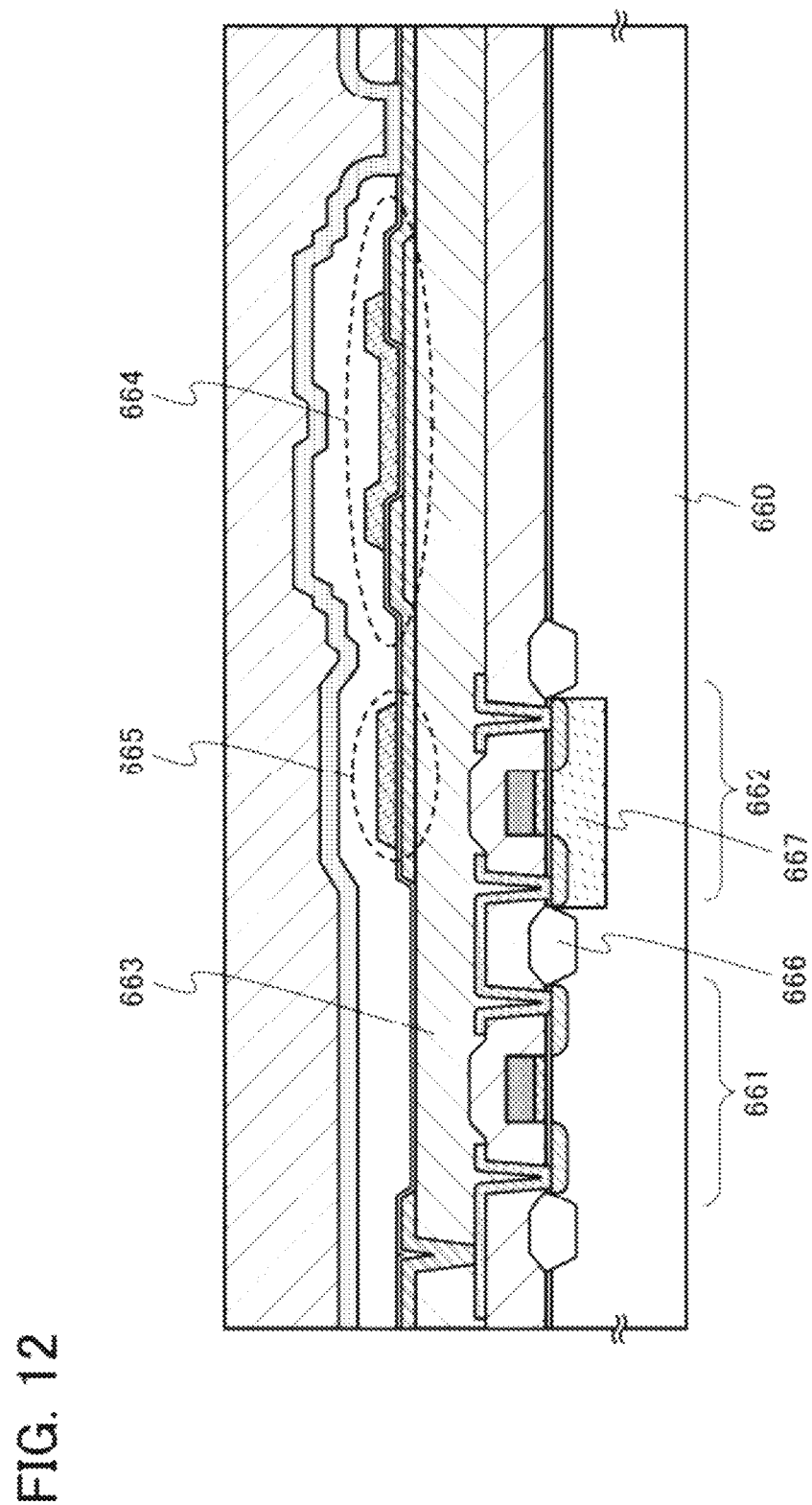
FIG. 12 is a cross-sectional view of a memory device.

In the memory device which is an embodiment of the present invention, a driver circuit may include a transistor which is manufactured using a bulk single crystal semiconductor substrate. In FIG. 12, a cross-sectional view of a memory device in which a transistor including an oxide semiconductor and a capacitor are formed over a transistor which is formed using the bulk single crystal semiconductor substrate is illustrated as an example.

The memory device illustrated in FIG. 12 includes an n-channel transistor 661 and a p-channel transistor 662 which are provided over a semiconductor substrate 660, a transistor 664 which is provided over an insulating film 663 covering the n-channel transistor 661 and the p-channel transistor 662 and which includes an oxide semiconductor, and a capacitor 665.

Although the case where the transistor 664 includes an oxide semiconductor in a channel formation region and has a structure described in Embodiment 4 is described as an example, the structure may be that described in Embodiment 5 or 6.

The semiconductor substrate 660 can be, for example, a single crystal silicon substrate having n-type or p-type conductivity, a compound semiconductor substrate (e.g., a GaAs substrate, an InP substrate, a GaN substrate, a SiC substrate, a sapphire substrate, or a ZnSe substrate), or the like. In FIG. 12, the case where a single crystal silicon substrate having n-type conductivity is used is illustrated as an example.

In addition, the n-channel transistor 661 and the p-channel transistor 662 are electrically isolated by an element isolation insulating film 666. For formation of the element isolation insulating film 666, a selective oxidation method (local oxidation of silicon (LOCOS) method), a trench isolation method, or the like can be used.

In a region where the p-channel transistor 662 is formed, a region called a p-well 667 is formed by selectively introducing an impurity element imparting p-type conductivity. In the case where a semiconductor substrate having p-type conductivity is used, an impurity element imparting n-type conductivity may be selectively introduced to a region where the n-channel transistor 661 is formed, so that an n-well may be formed.

This embodiment can be implemented by being combined as appropriate with any of the above embodiments.

(Embodiment 8)

An oxide semiconductor preferably contains at least indium (In) or zinc (Zn). In particular, both In and Zn are preferably contained.

As a stabilizer for reducing variation in electric characteristics of a transistor including the oxide semiconductor, it is preferable that one or more selected from gallium (Ga), tin (Sn), hafnium (Hf), aluminum (Al), or lanthanoid be contained.

As lanthanoid, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As a single-component metal oxide included in the oxide semiconductor, including indium (In) or zinc (Zn), for example, an indium oxide, a zinc oxide, or the like can be used.

As a two-component metal oxide included in the oxide semiconductor, including indium (In) or zinc (Zn), for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

As a three-component metal oxide included in the oxide semiconductor, including indium (In) or zinc (Zn), for example, an In—Ga—Zn-based oxide (also referred to as IGZO), an In—Sn—Zn-based oxide, a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

As a four-component metal oxide included in the oxide semiconductor, including indium (In) or zinc (Zn), for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that, for example, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used.

Alternatively, an In—Sn—Zn-based oxide with an atomic ratio of In:Sn: Zn=1:1:1 (=1/3:1/3:1/3), In: Sn: Zn=2:1:3 (=1/3:1/6:1/2), or In: Sn: Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

In the case where the oxide semiconductor is non-single-crystal, the oxide semiconductor may be either amorphous or polycrystalline. Further, the oxide semiconductor may have a structure including a crystalline portion in an amorphous portion. Note that it is preferable to use non-amorphous because amorphous includes many defects.

This embodiment can be implemented by being combined as appropriate with any of the above embodiments.

(Embodiment 9)

In this embodiment, an oxide including a crystal with c-axis alignment (also referred to as C-Axis Aligned Crystal (CAAC)), which has a triangular or hexagonal atomic arrangement when seen from the direction of an a-b plane, a surface, or an interface, and in which metal atoms are arranged in a layered manner, or metal atoms and oxygen atoms are arranged in a layered manner along the c-axis, and the direction of the a-axis or the b-axis is varied in the a-b plane (the crystal rotates around the c-axis) will be described.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clearly determined in some cases.

Nitrogen may be substituted for part of oxygen included in the CAAC. The c-axes of individual crystalline portions included in the CAAC may be aligned in a certain direction (e.g., a direction perpendicular to a surface of a substrate over which the CAAC is formed or a surface of the CAAC). Alternatively, the normals of the a-b planes of the individual crystalline portions included in the CAAC may be aligned in a certain direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 13A to 13E, O surrounded by a circle represents tetracoordinate O and O surrounded by a double circle represents tricoordinate O.

Figure 13A:
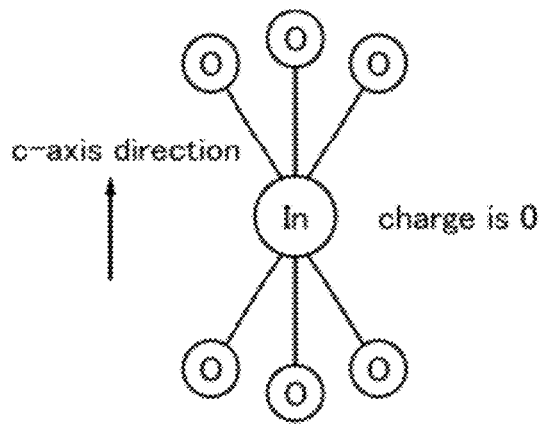
FIGS. 13A to 13E are examples of an oxide semiconductor.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
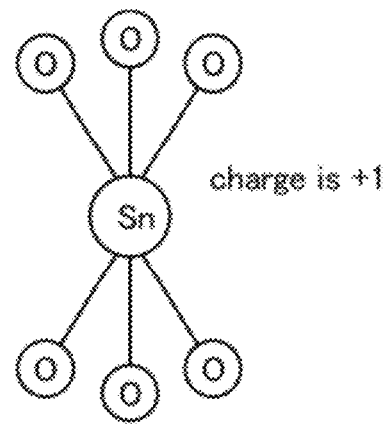
Figure 13B:
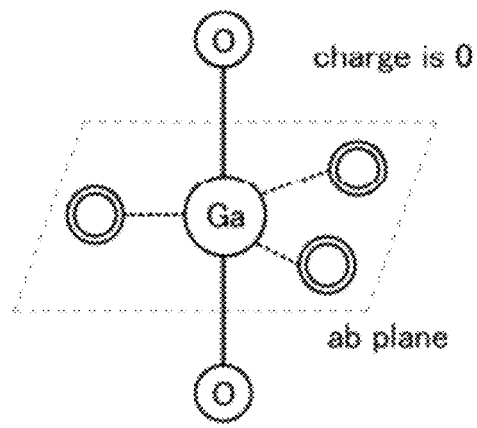

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All of the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
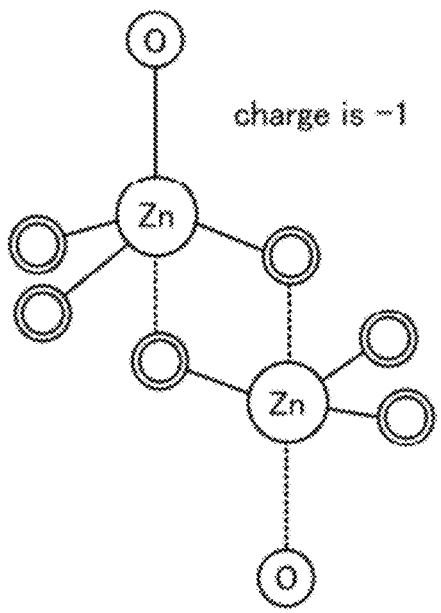
Figure 13C:
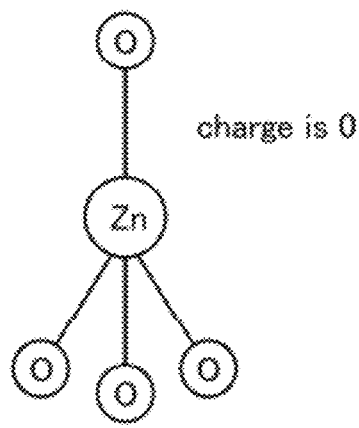

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half In the small group illustrated in FIG. 13D, electric charge is +1.

FIG. 13E illustrates a small group including two Zn atoms. In FIG. 13E, one tetracoordinate O atom exists in each of an upper half and a lower half In the small group illustrated in FIG. 13E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom in FIG. 13B has one proximate Ga atom in the downward direction, and the one O atom in the lower half has one proximate Ga atom in the upward direction. The one O atom in the upper half with respect to the tetracoordinate Zn atom in FIG. 13C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4 is bonded to another metal atom through a tetracoordinate O atom in the c-axis direction. In addition to the above, a medium group can be formed in a different manner by combining a plurality of small groups so that the total electric charge of the layered structure is 0.

Figure 14A:
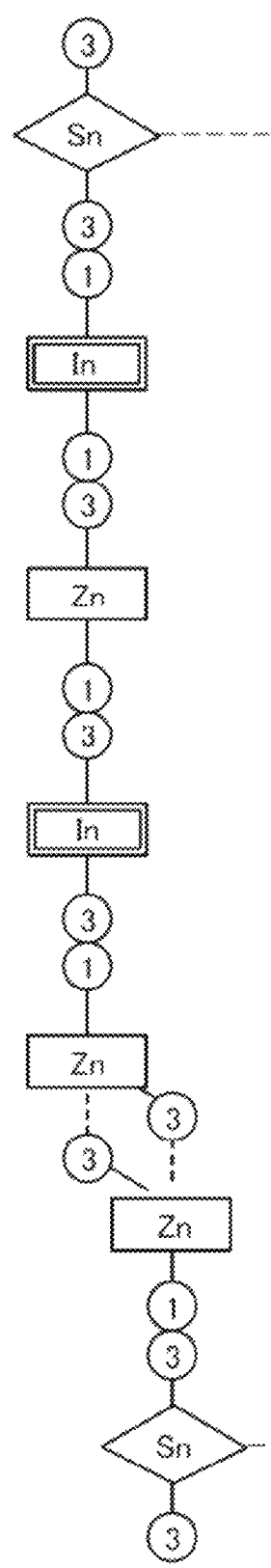
FIGS. 14A to 14C are examples of an oxide semiconductor.
Figure 14B:
Figure 14C:

FIG. 14A illustrates a model of a medium group included in a layered structure of an In—Sn—Zn-based oxide. FIG. 14B illustrates a large group including three medium groups. Note that FIG. 14C illustrates an atomic arrangement in the case where the layered structure in FIG. 14B is observed from the c-axis direction.

In FIG. 14A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively.

Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn-based oxide crystal ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 15A illustrates a model of a medium group included in a layered structure of an In—Ga—Zn-based oxide.

In the medium group included in the layered structure of the In—Ga—Zn-based oxide in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 15B illustrates a large group including three medium groups. Note that FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 15A but also a medium group in which the arrangement of the In atom, the Ga atom, and the Zn atom is different from that in FIG. 15A.

This embodiment can be implemented by being combined as appropriate with any of the above embodiments.

(Embodiment 10)

The actually measured mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the mobility on the assumption that no defect exists inside the semiconductor can be calculated theoretically.

Assuming that the original mobility and the measured mobility of a semiconductor are $\mu_0$ and $\mu$, respectively, and a potential barrier (such as a grain boundary) exists in the semiconductor, the mobility $\mu$ can be expressed by the following Formula 1.

$$\mu = \mu_0 \exp\left(-\frac{E}{kT}\right) \qquad \text{[Formula 1]}$$

E represents the height of the potential barrier, k represents the Boltzmann constant, and T represents the absolute temperature. When the potential barrier E is assumed to be attributed to a defect, the height of the potential barrier can be expressed by the following Formula 2 according to the Levinson model.

$$E = \frac{e^2 N^2}{8\varepsilon n} = \frac{e^3 N^2 t}{8\varepsilon C_{ox} V_g} \qquad \text{[Formula 2]}$$

Note that e represents the elementary charge, N represents the average defect density per unit area in a channel formation region, ε represents the permittivity of the semiconductor, n represents the number of carriers per unit area in the channel formation region, $C_{ox}$ represents the capacitance per unit area, $V_g$ represents the gate voltage, and t represents the thickness of a channel formation region. In the case where the thickness of the semiconductor film is less than or equal to 30 nm, the thickness of the channel formation region may be regarded as being the same as the thickness of the semiconductor film.

The drain current $I_d$ in a linear region can be expressed by the following Formula 3.

$$I_d = \frac{W \mu V_g V_d C_{ox}}{L} \exp\left(-\frac{E}{kT}\right) \qquad \text{[Formula 3]}$$

Note that L represents the channel length and W represents the channel width, and L and W are each 10 μm. In addition, $V_d$ represents the drain voltage.

When dividing both sides of the Formula 3 by $V_g$ and then taking logarithms of both sides, the following Formula 4 can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \qquad \text{[Formula 4]}$$

The right side of Formula 4 is a function of $V_g$. From Formula 4, it is found that the defect density N can be obtained from the slope of a line with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs. The measured mobility $\mu$ of an In—Sn—Zn-based oxide semiconductor including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel formation region and a gate insulating film affects the transport property of the transistor. In other words, the mobility $\mu_1$ at a position that is distance x away from the interface between the channel formation region and the gate insulating film can be expressed by the following Formula 5.

$$\frac{1}{\mu_1} = \frac{1}{\mu_0} + \frac{D}{B}\exp\left(-\frac{x}{G}\right) \qquad \text{[Formula 5]}$$

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of the right side of Formula 5 is increased and accordingly the mobility $\mu_1$ is decreased.

Figure 16:
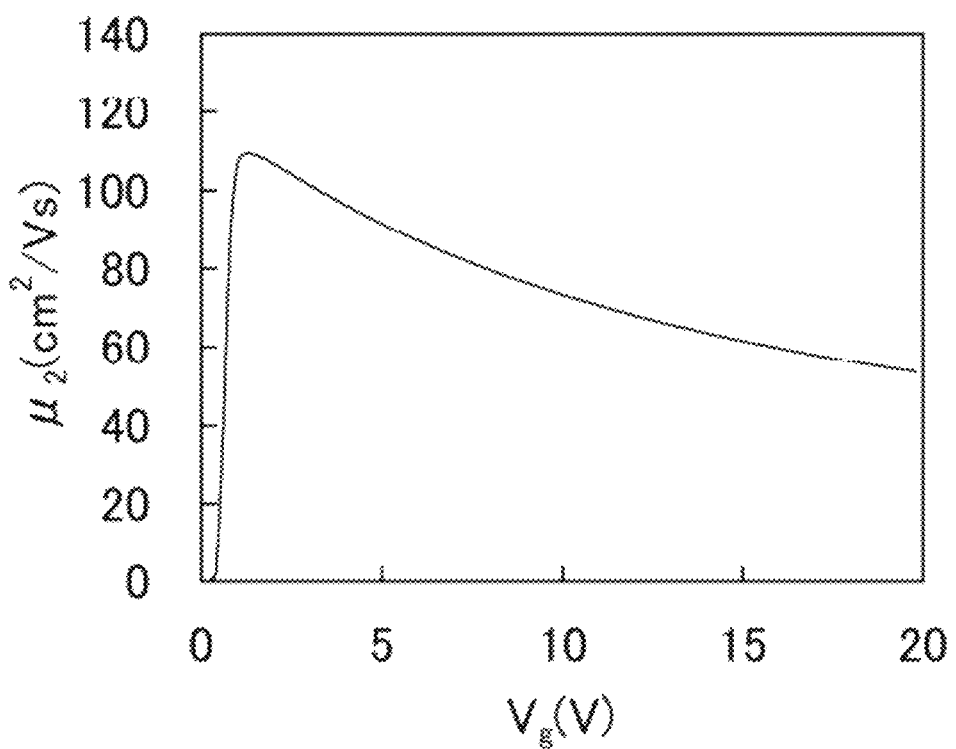
FIG. 16 illustrates a relation between gate voltage and mobility.

Calculation results of the mobility $\mu_2$ of a transistor in which a channel formation region includes an ideal oxide semiconductor without a defect inside the semiconductor are shown in FIG. 16. For the calculation, device simulation software Sentaurus Device manufactured by Synopsys, Inc. was used. In the calculation, the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating film was assumed to be 100 nm, and the relative permittivity thereof was assumed to be 4.1. The channel length L and the channel width W were each assumed to be 10 um, and the drain voltage $V_d$ was assumed to be 0.1 V.

As shown in the calculation result shown in FIG. 16, the mobility $\mu_2$ has a peak of more than 100 cm$^2$/Vs at a gate voltage $V_g$ that is a little over 1 V and is decreased as the gate voltage $V_g$ becomes higher because the influence of interface scattering is increased. Note that in order to reduce interface scattering, it is preferable that a surface of the semiconductor film be flat at the atomic level (atomic layer flatness).

Calculation results of characteristics of minute transistors which are manufactured using an oxide semiconductor having such a mobility are shown. The transistor used for the calculation has an oxide semiconductor film in which a channel formation region is provided between a pair of n-type semiconductor region. In the calculation, the resistivities of the pair of n-type semiconductor region are $2\times10^{-3}$ Ωcm. Note that the channel length L of this transistor is 33 nm and the channel width W of this transistor is 40 nm. Further, the calculation was performed under the condition that part of the semiconductor region which overlaps with the sidewall is an offset region, assuming that a sidewall is formed on the side walls of a gate electrode. For the calculation, Sentaurus Device which is software manufactured by Synopsys, Inc. was used.

Figure 17A:
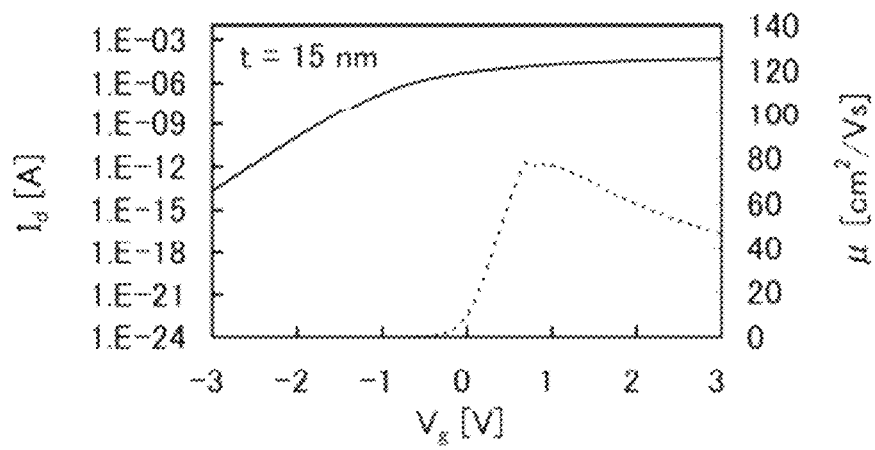
FIGS. 17A to 17C each illustrate a relation between gate voltage and drain current.
Figure 17B:
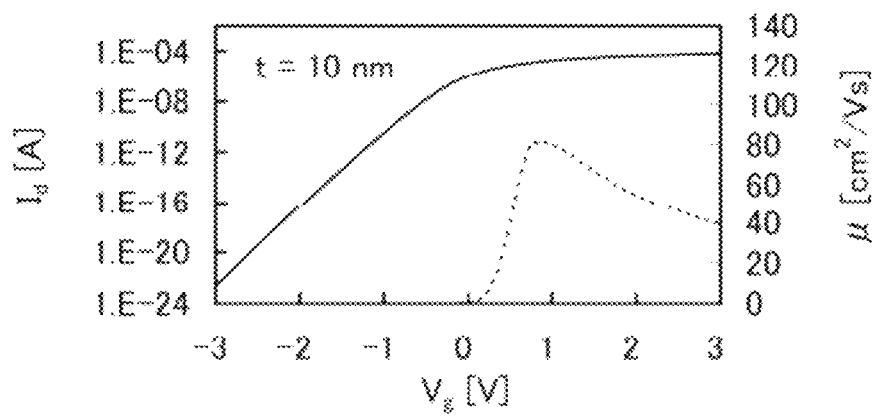
Figure 17C:
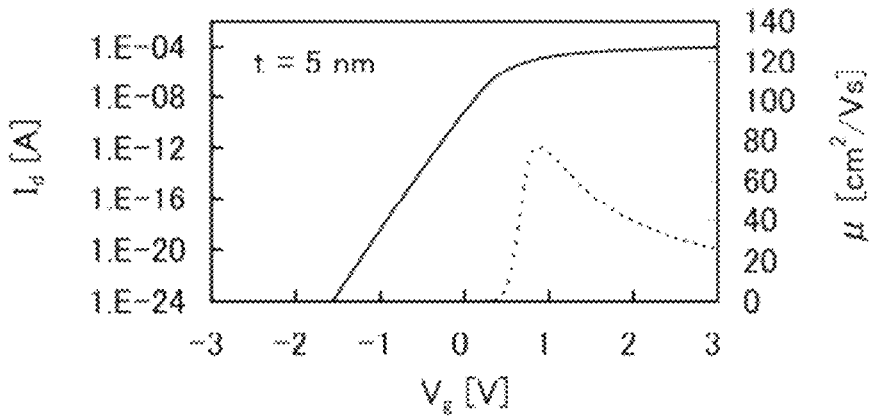

FIGS. 17A to 17C show the calculation result of the gate voltage ($V_g$: a potential difference between the gate electrode and the source electrode) dependence of the drain current ($I_d$, a solid line) and the mobility (μ, a dotted line) of the transistor. The drain current $I_d$ is obtained by calculation under the assumption that the drain voltage ($V_d$, a potential difference between the drain electrode and the source electrode) is +1 V and the mobility μ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility μ and the drain current $I_d$ in an on state (on-state current).

Figure 18A:
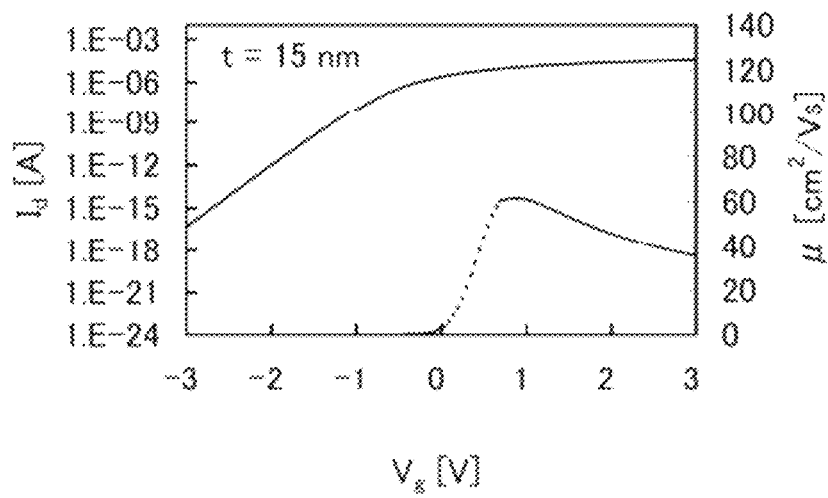
FIGS. 18A to 18C each illustrate a relation between gate voltage and drain current.
Figure 18B:
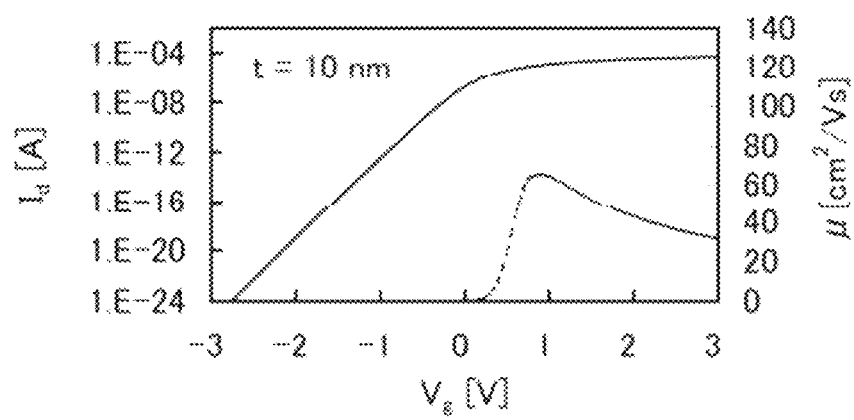
Figure 18C:
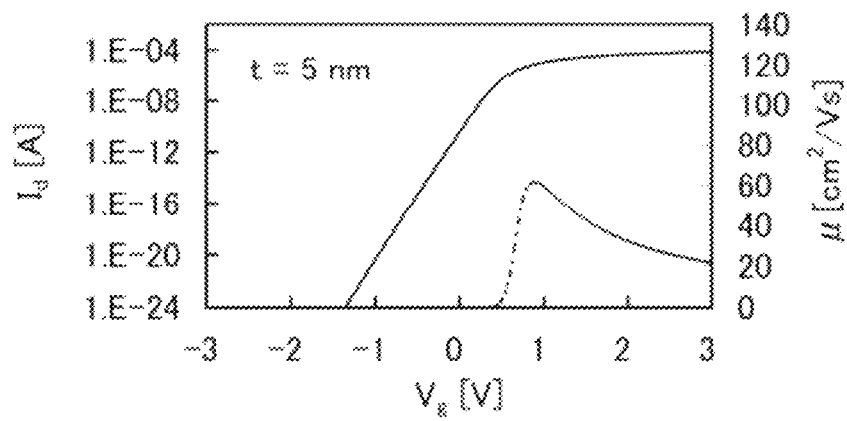

FIGS. 18A to 18C show the gate voltage $V_g$ dependence of the drain current $I_d$ (a solid line) and the mobility μ (a dotted line) of the transistor where the offset length (the sidewall length) $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 18A shows the gate voltage dependence of the transistor in the case where the thickness t of the gate insulating film is 15 nm, FIG. 18B shows that of the transistor in the case where the thickness t of the gate insulating film is 10 nm, and FIG. 18C shows that of the transistor in the case where the thickness t of the gate insulating film is 5 nm.

Figure 19A:
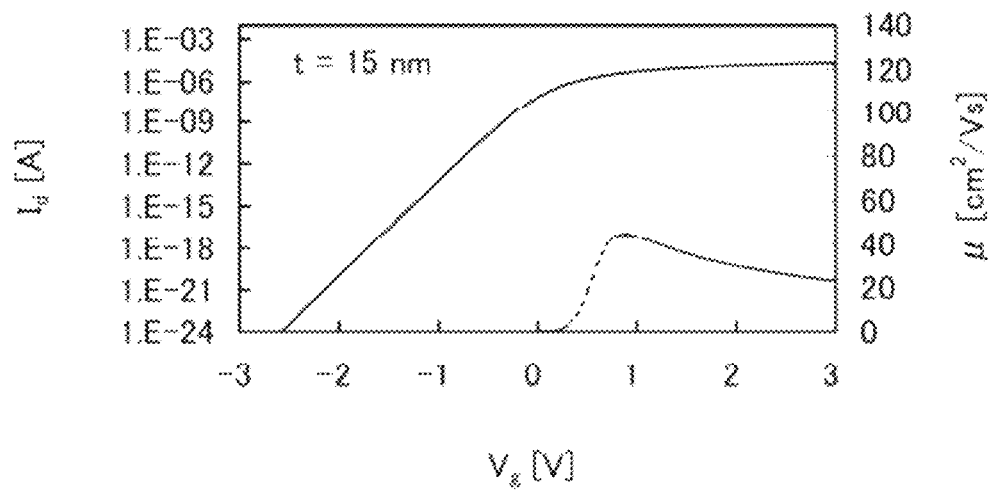
FIGS. 19A to 19C each illustrate a relation between gate voltage and drain current.
Figure 19B:
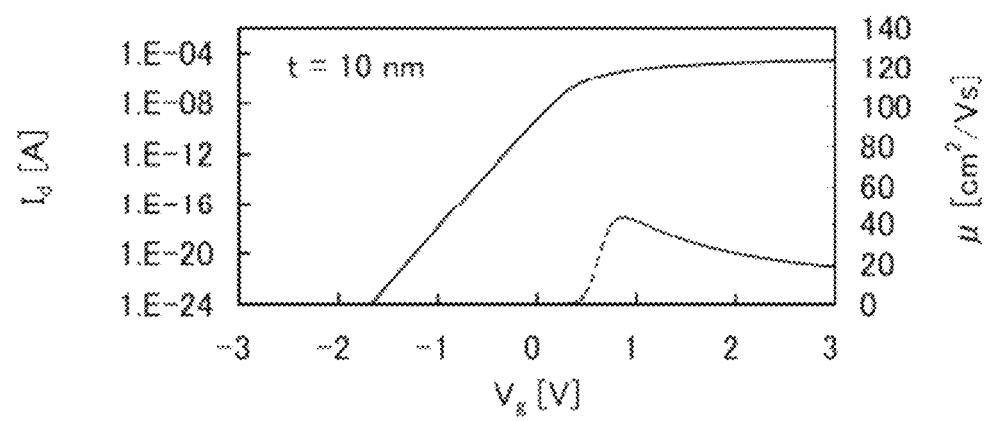
Figure 19C:
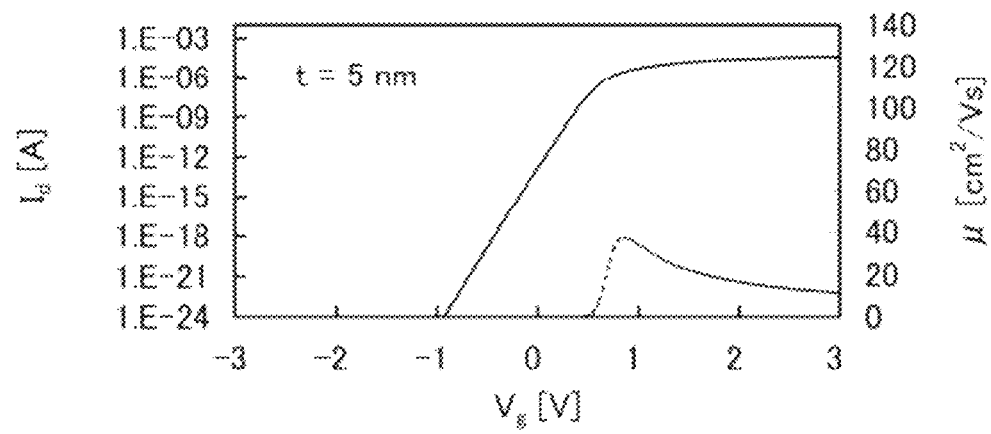

Further, FIGS. 19A to 19C show the gate voltage dependence of the drain current $I_d$ (a solid line) and the mobility μ (a dotted line) of the transistor where the offset length (the sidewall length) $L_{off}$ is 15 nm. The drain current $I_d$ is obtained by calculation under the assumption that the drain voltage $V_d$ is +1 V and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm. In either of the structures, as the gate insulating film is thinner, the off-state current is significantly decreased, whereas no noticeable change arises in the peak value of the mobility μ and the on-state current.

Note that the peak of the mobility μ is approximately 80 $cm^2/Vs$ in FIGS. 17A to 17C, approximately 60 $cm^2/Vs$ in FIGS. 18A to 18C, and approximately 40 $cm^2/Vs$ in FIGS. 19A to 19C; thus, the peak of the mobility μ is decreased as the offset length $L_{off}$ is increased. Further, the same applies to the off-state current. The on-state current is also decreased as the offset length $L_{off}$ is increased; however, the reduction in the on-state current is much more gradual than the reduction in off-state current. Further, any of the graphs shows that the drain current $I_d$ exceeds 10 mA, which is needed for a memory element or the like, at a gate voltage $V_g$ of around 1 V.

This embodiment can be implemented by being combined as appropriate with any of the above embodiments.

EXAMPLE 1

The memory device according to an embodiment of the present invention can operate at high speed, and has low power consumption, high storage capacitance per unit area, and high reliability. Accordingly, by using the memory device according to an embodiment of the present invention, an electronic device with low power consumption, an electronic device which can operate at high speed, a small electronic device, and a highly reliable electronic device can be provided.

The memory device according to an embodiment of the present invention can be used for display devices, laptop personal computers, or image reproducing devices provided with recording media (typically, devices which reproduce the content of recording media such as digital versatile discs (DVDs) and have displays for displaying the reproduced images). Other than the above, as an electronic device which can be provided with the memory device according to an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multi-function printers, automated teller machines (ATM), vending machines, and the like can be given. Specific examples of such electronic appliances are illustrated in FIGS. 11A to 11C.

Figure 11A:
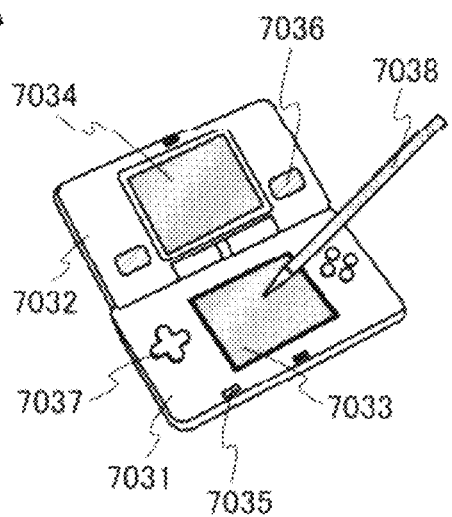
FIGS. 11A to 11C each illustrate an electronic device.

FIG. 11A illustrates a portable game machine including a housing 7031, a housing 7032, a display portion 7033, a display portion 7034, a microphone 7035, speakers 7036, an operation key 7037, a stylus 7038, and the like. The memory device according to an embodiment of the present invention can be used for an integrated circuit for controlling driving of the portable game machine. In that case, a portable game machine with low power consumption, a portable game machine which can operate at high speed, a small portable game machine, or a highly reliable portable game machine can be provided. Although the portable game machine illustrated in FIG. 11A includes two display portions, the display portion 7033 and the display portion 7034, the number of display portions included in the portable game machine is not limited to two.

Figure 11B:
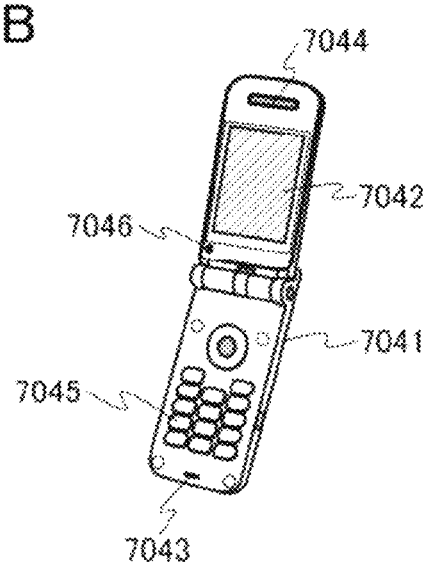

FIG. 11B illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The memory device according to an embodiment of the present invention can be used for an integrated circuit for controlling driving of the mobile phone. In that case, a mobile phone with low power consumption, a mobile phone which can operate at high speed, a small mobile phone, or a highly reliable mobile phone can be provided.

Figure 11C:
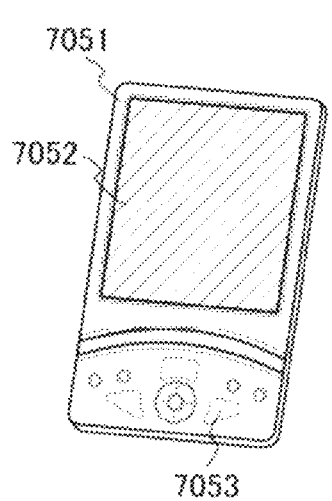

FIG. 11C illustrates a portable information terminal including a housing 7051, a display portion 7052, operation keys 7053, and the like. A modem may be incorporated in the housing 7051 of the portable information terminal illustrated in FIG. 11C. The memory device according to an embodiment of the present invention can be used for an integrated circuit for controlling driving of the portable information terminal. In that case, a portable information terminal with low power consumption, a portable information terminal which can operate at high speed, a small portable information terminal, or a highly reliable portable information terminal can be provided.

Example 1 can be implemented by being combined as appropriate with any of the above embodiments.

EXAMPLE 2

A transistor including an oxide semiconductor containing In, Sn, and Zn can have favorable characteristics by deposition of the oxide semiconductor while heating a substrate or by heat treatment after deposition of an oxide semiconductor film. Each of In, Sn, and Zn is preferably contained in a composition ratio at greater than or equal to 5 atomic %.

By heating the substrate after the deposition of the oxide semiconductor film containing In, Sn, and Zn, the mobility of the transistor can be improved. The threshold voltage of an n-channel transistor can also be shifted in the positive direction. The positive shift of the threshold voltage of the n-channel transistor makes the absolute value of a voltage used for keeping the n-channel transistor off to decrease, so that power consumption can be reduced. Further, the n-channel transistor can become a normally-off transistor by a positive shift of the threshold voltage of the n-channel transistor such that the threshold voltage is 0 V or more.

Characteristics of transistors using the oxide semiconductor containing In, Sn, and Zn are described below.
(Common Conditions of Samples A to C)

An oxide semiconductor film was formed over a substrate to have a thickness of 15 nm under the following conditions: a target having a composition ratio of In:Sn:Zn=1:1:1 is used; the gas flow rate is $Ar/O_2=6/9$ sccm; the deposition pressure is 0.4 Pa; and the deposition power is 100 W. Next, the oxide semiconductor film was etched in an island shape. Then, a tungsten layer was deposited over the oxide semiconductor layer to have a thickness of 50 nm, and was etched, so that a source electrode and a drain electrode were formed.

Next, a silicon oxynitride film (SiON) was formed to have a thickness of 100 nm, using silane gas ($SiH_4$) and dinitrogen monoxide ($N_2O$) by a plasma-enhanced CVD method, to form a gate insulating layer. Next, a gate electrode was formed in the following manner: a tantalum nitride layer was formed to have a thickness of 15 nm; a tungsten layer was formed to have a thickness of 135 nm; and the layers were etched. Further, a silicon oxynitride (SiON) film was formed so as to have a thickness of 300 nm by a plasma-enhanced CVD method, and then, a polyimide film was formed so as to have a thickness of 1.5 um, thereby forming an interlayer insulating film.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and the films were etched.

In this manner, a semiconductor device having a transistor was formed.

(Sample A)

In Sample A, heating was not performed to the substrate during the deposition of the oxide semiconductor film. Further in Sample A, heat treatment was not performed after the deposition of the oxide semiconductor film before the etching of the oxide semiconductor film.
(Sample B)

In Sample B, the oxide semiconductor film was deposited with the substrate heated at 200° C. Further in Sample B, heat treatment was not performed after the deposition of the oxide semiconductor film before the etching of the oxide semiconductor film. The substrate was heated while the oxide semiconductor film was deposited in order to remove hydrogen serving as a donor in the oxide semiconductor film.
(Sample C)

In Sample C, the oxide semiconductor film was deposited with the substrate heated at 200° C. Further in Sample C, heat treatment in a nitrogen atmosphere was performed at 650° C. for 1 hour and then heat treatment in an oxygen atmosphere was performed at 650° C. for 1 hour after the oxide semiconductor film was deposited before the oxide semiconductor film was etched. The heat treatment in a nitrogen atmosphere at 650° C. for 1 hour was performed in order to remove hydrogen serving as a donor in the oxide semiconductor film.

Note that oxygen is also removed by the heat treatment used for removing hydrogen that serves as a donor in the oxide semiconductor film, causing oxygen deficiency which serves as a carrier in the oxide semiconductor film. Hence, an effect of reducing oxygen deficiencies was tried to be obtained by performing the heat treatment in an oxygen atmosphere at 650° C. for 1 hour.
(Characteristics of Transistors of Sample A to Sample C)

Figure 20A:
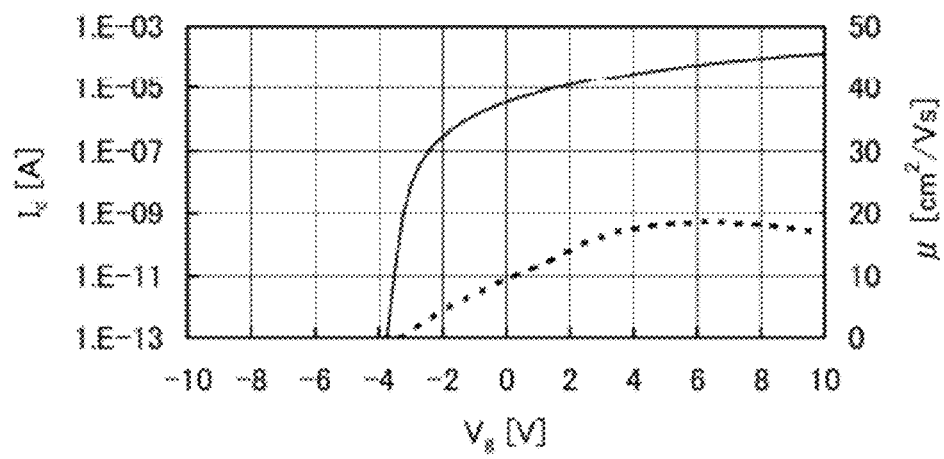
FIGS. 20A to 20C each illustrate the characteristics of a transistor.
Figure 20B:
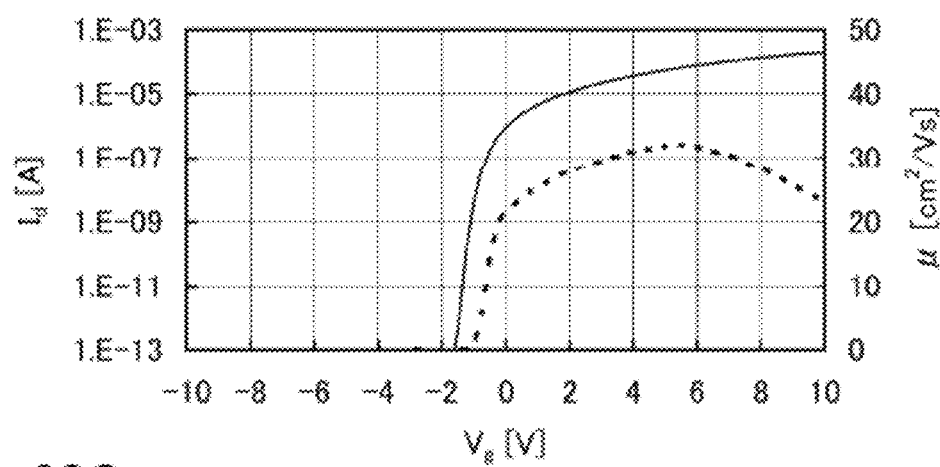
Figure 20C:
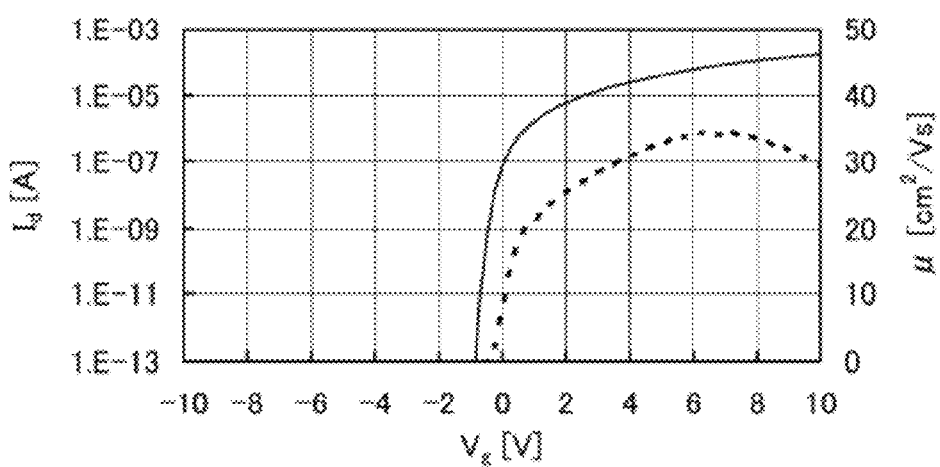

FIG. 20A shows initial characteristics of a transistor of Sample A. FIG. 20B shows initial characteristics of a transistor of Sample B. FIG. 20C shows initial characteristics of a transistor of Sample C.

The mobility of the transistor of Sample A was 18.8 $cm^2/Vs$. The mobility of the transistor of Sample B was 32.2 $cm^2/Vs$. The mobility of the transistor of Sample C was 34.5 $cm^2/Vs$.

According to observation of cross sections of oxide semiconductor films which were formed by deposition methods similar to respective those of Samples A to C, with a transmission electron microscope (TEM), crystallinity was observed in samples formed by the deposition methods similar to respective those of Sample B and Sample C, substrates of which were heated during deposition.

Further, surprisingly, the samples, the substrates of which were heated during deposition, had a non-crystalline portion and a crystalline portion having a c-axis crystalline orientation. In a conventional polycrystal, the crystalline orientation in the crystalline portion is not aligned. Therefore, it can be said that the sample, the substrate of which was heated during deposition, has a novel crystal structure.

Comparison of FIGS. 20A to 20C brings understanding that heat treatment performed to the substrate during or after deposition can remove an hydrogen element serving as a donor, thereby shifting the threshold voltage of the n-channel transistor in the positive direction. That is, the threshold voltage of Sample B with heating of the substrate during deposition is shifted in the positive direction as compared to the threshold voltage of Sample A without heating of the substrate during deposition.

In addition, it is found from comparison of Sample B and Sample C both with heating of the substrate during deposition that the threshold voltage of Sample C with the heat treatment after deposition is shifted in the positive direction as compared to the threshold voltage of Sample B without the heat treatment after deposition. As the temperature of heat treatment is higher, a light element such as hydrogen is removed more easily; therefore, as the temperature of heat treatment is higher, hydrogen is removed more easily. Accordingly, it can be considered that the threshold voltage can be more shifted in the positive direction by further increasing the temperature of the heat treatment during or after deposition.

(Results of the Gate BT Stress Test of Sample B and Sample C)

A gate BT stress test was performed on Sample B (without heat treatment after deposition) and Sample C (with heat treatment after deposition).

First, $V_g$-$I_d$ characteristics of each transistor were measured at a substrate temperature of 25° C. and $V_d$ of 10 V, whereby the characteristics of the transistor before heating and application of a high positive voltage were measured. Next, the substrate temperature was set to 150° C. and $V_d$ was set to 0.1 V. After that, 20 V was applied as $V_g$ to the gate insulating film, and was kept for 1 hour. Then, $V_g$ was set to 0 V. Next, $V_g$-$I_d$ characteristics of the transistor were measured at a substrate temperature of 25° C. and $V_d$ of 10 V, whereby the characteristics of the transistor after heating and application of a high positive voltage were measured.

Comparison of the characteristics of a transistor before and after heating and application of a high positive voltage as described above is referred to as a positive BT test.

On the other hand, first, $V_g$-$I_d$ characteristics of each transistor were measured at a substrate temperature of 25° C. and $V_d$ of 10 V, whereby the characteristics of the transistor before heating and application of a high negative voltage were measured. Then, the substrate temperature was set to 150° C. and $V_d$ was set to 0.1 V. Next, −20 V was applied as $V_g$ to the gate insulating film, and was kept for 1 hour. Next, $V_g$ was set to 0 V. Then, $V_g$-$I_d$ characteristics of the transistor were measured at a substrate temperature of 25° C. and $V_d$ of 10 V, whereby the characteristics of the transistor after heating and application of a high negative voltage were measured.

Comparison of the characteristics of the transistor before and after heating and application of a high negative voltage as described above is referred to as a negative BT test.

Figure 21A:
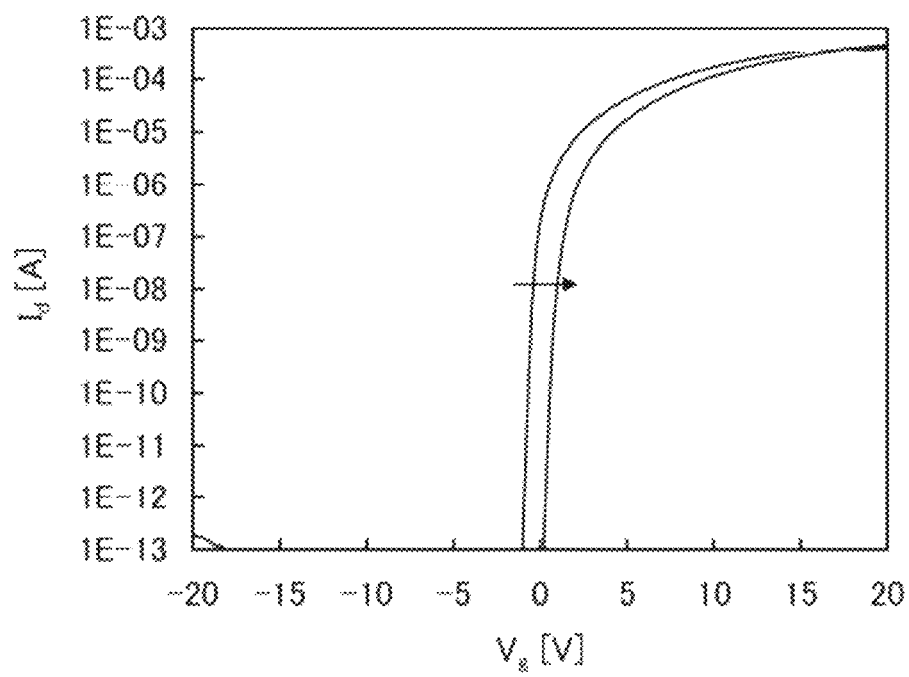
FIGS. 21A and 21B each illustrate the characteristics of a transistor.
Figure 21B:
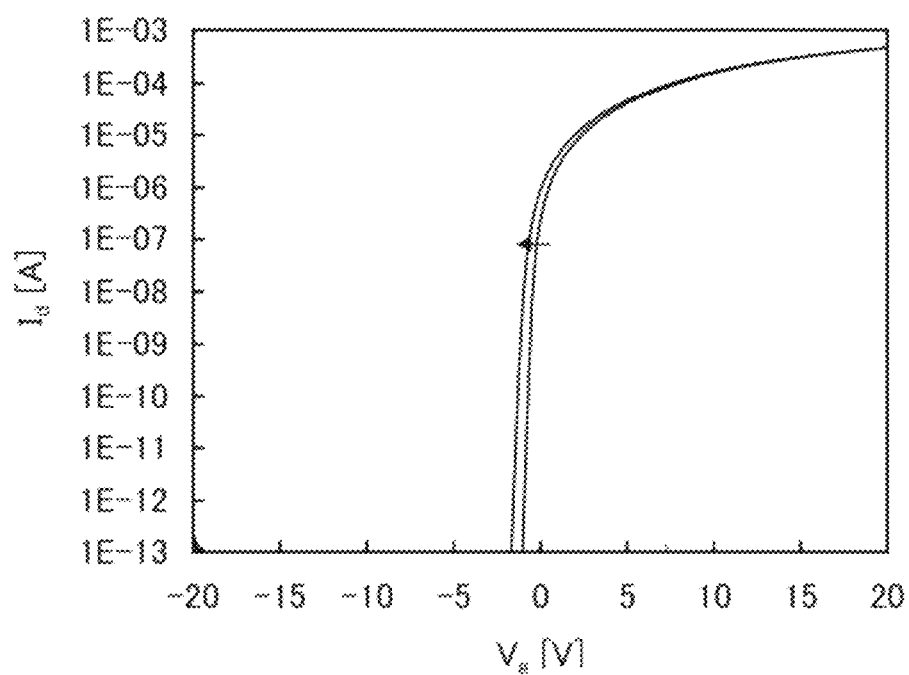
Figure 22A:
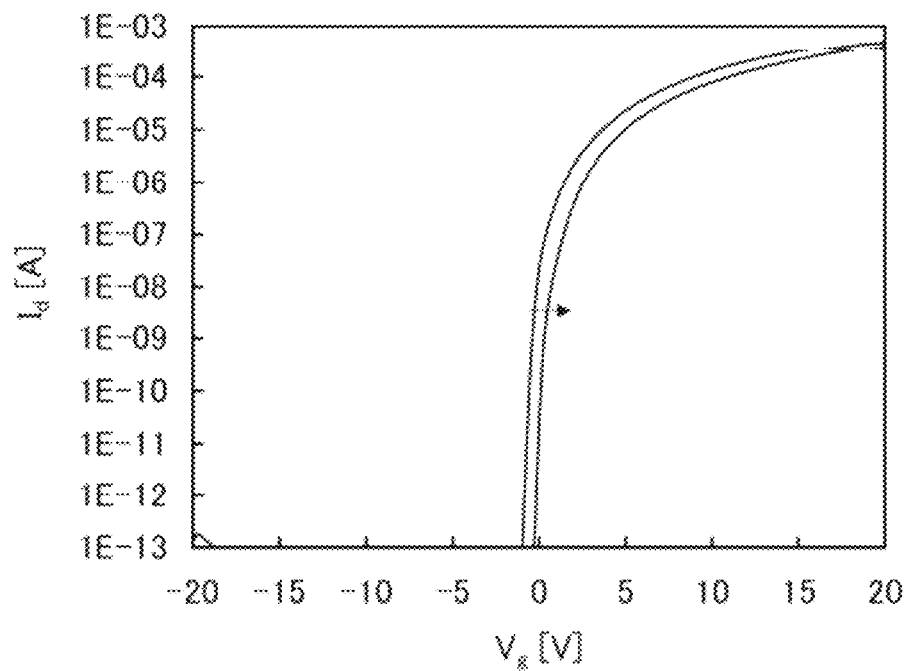
FIGS. 22A and 22B each illustrate the characteristics of a transistor.
Figure 22B:
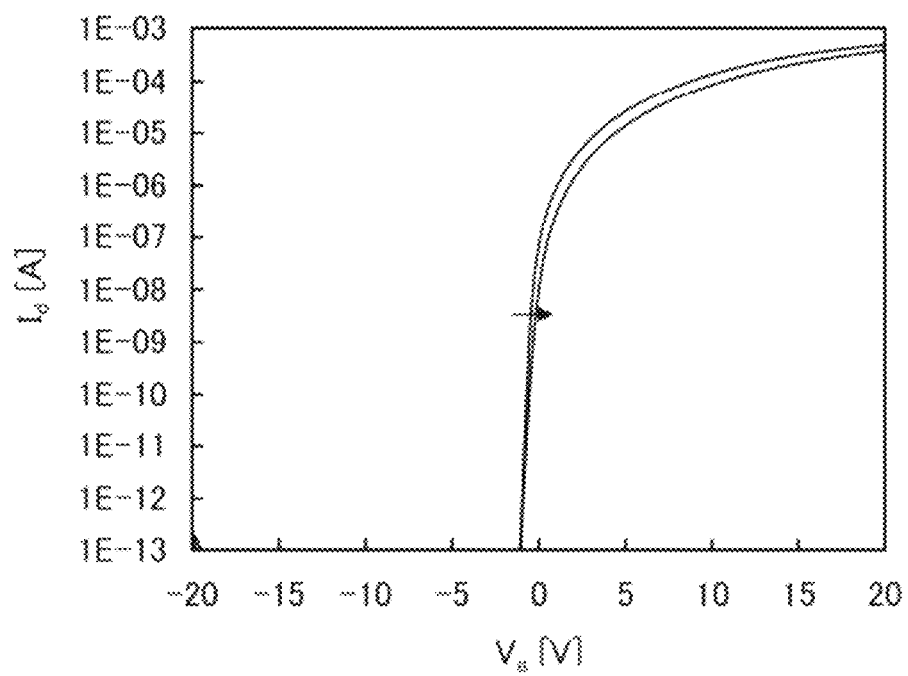

FIG. 21A shows results of the positive BT test of Sample B, and FIG. 21B shows results of the negative BT test of Sample B. FIG. 22A shows results of the positive BT test of Sample C, and FIG. 22B shows results of the negative BT test of Sample C. Although the positive BT test and the negative BT test are tests for determining the deterioration level of a transistor, it is found from FIGS. 21A and 22A that the threshold voltage can be shifted in the positive direction by performing at least the positive BT test.

In particular, it is found that the positive BT test made the transistor a normally-off transistor in FIG. 21A. Accordingly, it is found that, with the positive BT test as well as the heat treatment in manufacturing the transistors, a shift of the threshold voltage in the positive direction can be promoted and the transistor can be made to a normally-off transistor.

Figure 23:
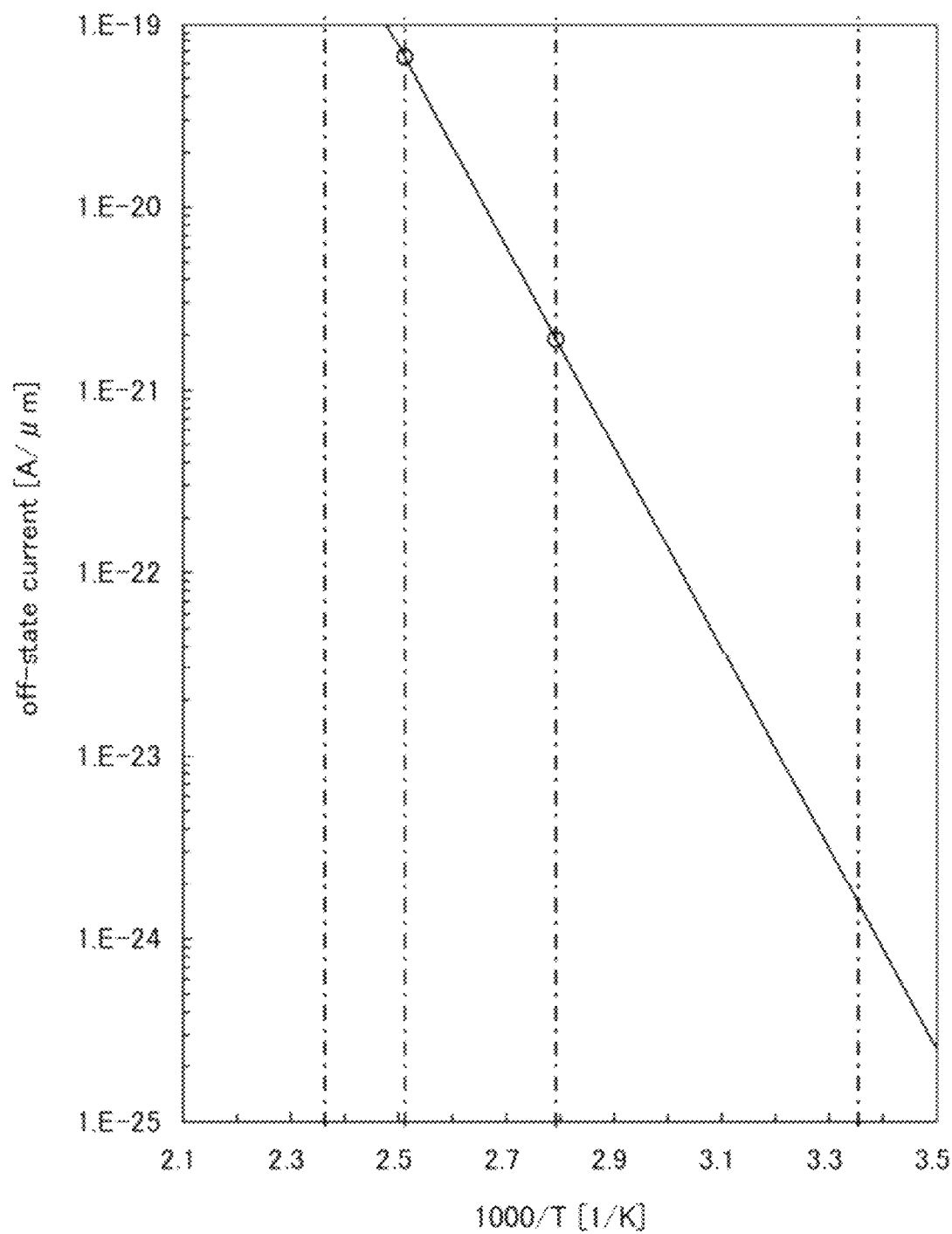
FIG. 23 illustrates the temperature dependence of off-state current of a transistor.

FIG. 23 shows a relation between the off-state current of the transistor of Sample A and the inverse of the substrate temperature (absolute temperature) at measurement. In FIG. 23, the horizontal axis represents a value (1000/T) obtained by multiplying the inverse of the substrate temperature at measurement by 1000. The amount of current in FIG. 23 is the amount of current per micrometer in the channel width.

The off-state current was lower than or equal to $1 \times 10^{-19}$ A at a substrate temperature of 125° C. (1000/T is about 2.51). The off-state current was lower than or equal to $1 \times 10^{-20}$ A at a substrate temperature of 85° C. (1000/T is about 3.66). In other words, it was found that the off-state current is extremely low as compared to a transistor including a silicon semiconductor. The off-state current is decreased as the temperature decreases; therefore, it is clear that the off-state current is lower at room temperature.

This application is based on Japanese Patent Application serial no. 2011-013908 filed with Japan Patent Office on Jan. 26, 2011, and Japanese Patent Application serial no. 2011-108895 filed with Japan Patent Office on May 14, 2011, the entire contents of which are hereby incorporated by reference.

What is claimed is:

1. A memory device comprising:
a first driver circuit comprising a first transistor;
a second driver circuit comprising a second transistor; and
a cell array over the first driver circuit and the second driver circuit,
wherein the cell array comprises a first region comprising a first cell, a second region comprising a second cell, a third region comprising a third cell, and a fourth region comprising a fourth cell,
wherein the first cell, the second cell, the third cell, and the fourth cell each comprise a third transistor and a capacitor electrically connected to the third transistor,
wherein a gate of the third transistor of the first cell and a gate of the third transistor of the second cell are electrically connected to a first word line,
wherein a gate of the third transistor of the third cell and a gate of the third transistor of the fourth cell are electrically connected to a second word line,
wherein one of a source and a drain of the third transistor of the first cell and one of a source and a drain of the third transistor of the third cell are electrically connected to a first data line
wherein one of a source and a drain of the third transistor of the second cell and one of a source and a drain of the third transistor of the fourth cell are electrically connected to a second data line,
wherein an insulating film is over the first driver circuit and the second driver circuit and under the cell array,
wherein the insulating film comprises a first contact hole, a second contact hole, a third contact hole, and a fourth contact hole,
wherein the first contact hole is between the first region and the second region when seen from a top view,
wherein the second contact hole is between the third region and the fourth region when seen from the top view,
wherein the third contact hole is between the first region and the third region when seen from the top view,
wherein the fourth contact hole is between the second region and the fourth region when seen from the top view,
wherein a first wiring electrically connected to the first driver circuit is in contact with the first word line through the first contact hole,
wherein a second wiring electrically connected to the first driver circuit is in contact with the second word line through the second contact hole,
wherein a third wiring electrically connected to the second driver circuit is in contact with the first data line through the third contact hole, wherein a fourth wiring electrically connected to the second driver circuit is in contact with the second data line through the fourth contact hole, and wherein the third transistor comprises an oxide semiconductor film comprising a channel formation region.

2. The memory device according to claim 1, wherein the oxide semiconductor film comprises In, Ga, and Zn.

3. The memory device according to claim 1, wherein a hydrogen concentration of the oxide semiconductor film is $1\times10^{19}/cm^3$ or less.

4. A semiconductor device comprising the memory device according to claim 1.

5. The memory device according to claim 1,
wherein each of the first transistor and the second transistor comprises silicon in a channel formation region, and
wherein the oxide semiconductor film is provided over the channel formation region of the first transistor.

6. A memory device comprising:
a first driver circuit comprising a first transistor;
a second driver circuit comprising a second transistor; and
a cell array over the first driver circuit and the second driver circuit,
wherein the cell array comprises a first region comprising a first cell, a second region comprising a second cell, a third region comprising a third cell, and a fourth region comprising a fourth cell,
wherein the first cell, the second cell, the third cell, and the fourth cell each comprise a third transistor and a capacitor electrically connected to the third transistor,
wherein a gate of the third transistor of the first cell and a gate of the third transistor of the second cell are electrically connected to a first word line,
wherein a gate of the third transistor of the third cell and a gate of the third transistor of the fourth cell are electrically connected to a second word line,
wherein one of a source and a drain of the third transistor of the first cell and one of a source and a drain of the third transistor of the third cell are electrically connected to a first data line,
wherein one of a source and a drain of the third transistor of the second cell and one of a source and a drain of the third transistor of the fourth cell are electrically connected to a second data line, wherein the first word line comprises a first power feeding point between the first region and the second region when seen from a top view,
wherein the second word line comprises a second power feeding point between the third region and the fourth region when seen from the top view,
wherein the first data line comprises a third power feeding point between the first region and the third region when seen from the top view,
wherein the second data line comprises a fourth power feeding point between the second region and the fourth region when seen from the top view,
wherein the first word line is supplied with a potential from the first driver circuit via the first power feeding point,
wherein the second word line is supplied with a potential from the first driver circuit via the second power feeding point,
wherein the first data line is supplied with a potential from the second driver circuit via the third power feeding point,
wherein the second data line is supplied with a potential from the second driver circuit via the fourth power feeding point, and
wherein the third transistor comprises an oxide semiconductor film comprising a channel formation region.

7. The memory device according to claim 6, wherein the oxide semiconductor film comprises In, Ga, and Zn.

8. The memory device according to claim 6, wherein a hydrogen concentration of the oxide semiconductor film is $1\times10^{19}/cm^3$ or less.

9. A semiconductor device comprising the memory device according to claim 6.

10. The memory device according to claim 6,
wherein each of the first transistor and the second transistor comprises silicon in a channel formation region, and
wherein the oxide semiconductor film is provided over the channel formation region of the first transistor.

* * * * *